US011049866B2

(12) United States Patent
Guo et al.

(10) Patent No.: US 11,049,866 B2
(45) Date of Patent: Jun. 29, 2021

(54) THREE-DIMENSIONAL MEMORY DEVICES HAVING THROUGH ARRAY CONTACTS AND METHODS FOR FORMING THE SAME

(71) Applicant: YANGTZE MEMORY TECHNOLOGIES CO., LTD., Wuhan (CN)

(72) Inventors: Mei Lan Guo, Wuhan (CN); Yushi Hu, Wuhan (CN); Ji Xia, Wuhan (CN); Hongbin Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/745,342

(22) Filed: Jan. 17, 2020

(65) Prior Publication Data

US 2020/0161321 A1    May 21, 2020

Related U.S. Application Data

(60) Division of application No. 16/149,103, filed on Oct. 1, 2018, now Pat. No. 10,566,336, which is a
(Continued)

(51) Int. Cl.
*H01L 27/11531* (2017.01)
*H01L 21/768* (2006.01)
(Continued)

(52) U.S. Cl.
CPC .. *H01L 27/11531* (2013.01); *H01L 21/76816* (2013.01); *H01L 21/76877* (2013.01);
(Continued)

(58) Field of Classification Search
CPC ......... H01L 27/11531; H01L 27/11524; H01L 27/11529; H01L 27/11556; H01L 27/1157;
(Continued)

(56) References Cited

U.S. PATENT DOCUMENTS

2012/0119287 A1    5/2012  Park et al.
2012/0280304 A1    11/2012 Lee et al.
(Continued)

FOREIGN PATENT DOCUMENTS

CN    106256005 A    12/2016
CN    106910746 A    6/2017
(Continued)

OTHER PUBLICATIONS

International Search Report issued in corresponding International Application No. PCT/CN2018/101482, dated May 5, 2019, 5 pages.
(Continued)

*Primary Examiner* — Dzung Tran
(74) *Attorney, Agent, or Firm* — Bayes PLLC

(57) ABSTRACT

Embodiments of three-dimensional (3D) memory devices having through array contacts (TACs) and methods for forming the same are disclosed. In an example, a method for forming a 3D memory device is disclosed. A dielectric stack including a plurality of dielectric/sacrificial layer pairs is formed on a substrate. A channel structure extending vertically through the dielectric stack is formed. A first opening extending vertically through the dielectric stack is formed. A spacer is formed on a sidewall of the first opening. A TAC extending vertically through the dielectric stack is formed by depositing a conductor layer in contact with the spacer in the first opening. A slit extending vertically through the dielectric stack is formed after forming the TAC. A memory stack including a plurality of conductor/dielectric layer pairs is formed on the substrate by replacing, through the slit, the sacrificial layers in the dielectric/sacrificial layer pairs with a plurality of conductor layers.

20 Claims, 20 Drawing Sheets

Related U.S. Application Data continuation of application No. PCT/CN2018/101482, filed on Aug. 21, 2018.

(51) Int. Cl.
*H01L 23/522* (2006.01)
*H01L 23/528* (2006.01)
*H01L 27/11524* (2017.01)
*H01L 27/11529* (2017.01)
*H01L 27/11556* (2017.01)
*H01L 27/1157* (2017.01)
*H01L 27/11573* (2017.01)
*H01L 27/11582* (2017.01)

(52) U.S. Cl.
CPC ...... *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ......... H01L 27/11573; H01L 27/11582; H01L 21/76816; H01L 21/76877; H01L 23/5226; H01L 23/5283
USPC ........................................................ 257/314
See application file for complete search history.

(56) References Cited

U.S. PATENT DOCUMENTS

| | | |
|---|---|---|
| 2013/0264631 A1 | 10/2013 | Alsmeier et al. |
| 2014/0175532 A1 | 6/2014 | Chen |
| 2015/0179660 A1* | 6/2015 | Yada ................. H01L 21/02164 257/321 |
| 2015/0206895 A1 | 7/2015 | Oh et al. |
| 2015/0236038 A1* | 8/2015 | Pachamuthu ..... H01L 27/11524 257/326 |
| 2016/0099255 A1 | 4/2016 | Lai |
| 2016/0322381 A1* | 11/2016 | Liu ................... H01L 29/40114 |
| 2017/0062454 A1* | 3/2017 | Lu ........................ H01L 29/7926 |
| 2017/0125430 A1 | 5/2017 | Nishikawa et al. |
| 2017/0179152 A1* | 6/2017 | Toyama ............ H01L 27/11582 |
| 2018/0331118 A1* | 11/2018 | Amano ............. H01L 21/76858 |

FOREIGN PATENT DOCUMENTS

| | | |
|---|---|---|
| CN | 106920794 A | 7/2017 |
| CN | 106920796 A | 7/2017 |
| CN | 107771356 A | 3/2018 |
| CN | 108140644 A | 6/2018 |
| CN | 108377660 A | 8/2018 |

OTHER PUBLICATIONS

Written Opinion of the International Searching Authority issued in corresponding International Application No. PCT/CN2018/101482, dated May 5, 2019, 4 pages.

\* cited by examiner

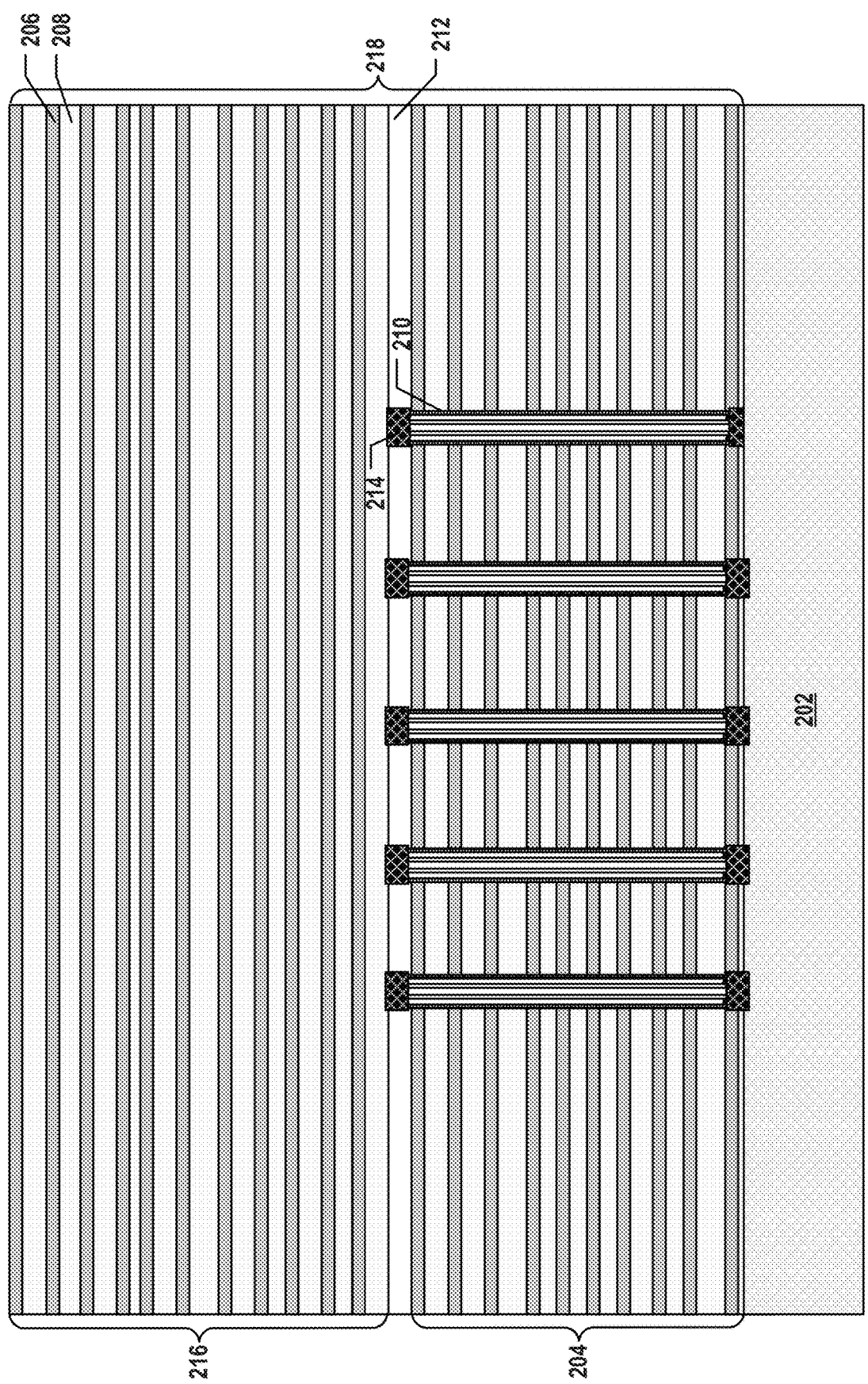

THREE-DIMENSIONAL MEMORY DEVICES HAVING THROUGH ARRAY CONTACTS AND METHODS FOR FORMING THE SAME

CROSS REFERENCE TO RELATED APPLICATION

This application is divisional of U.S. application Ser. No. 16/149,103, filed on Oct. 1, 2018, entitled "THREE-DIMENSIONAL MEMORY DEVICES HAVING THROUGH ARRAY CONTACTS AND METHODS FOR FORMING THE SAME," which is continuation of International Application No. PCT/CN2018/101482, filed on Aug. 21, 2018, entitled "THREE-DIMENSIONAL MEMORY DEVICES HAVING THROUGH ARRAY CONTACTS AND METHODS FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a method for forming a 3D memory device is disclosed. A dielectric stack including a plurality of dielectric/sacrificial layer pairs is formed on a substrate. A channel structure extending vertically through the dielectric stack is formed. A first opening extending vertically through the dielectric stack is formed. A spacer is formed on a sidewall of the first opening. A through array contact (TAC) extending vertically through the dielectric stack is formed by depositing a conductor layer in contact with the spacer in the first opening. A slit extending vertically through the dielectric stack is formed after forming the TAC. A memory stack including a plurality of conductor/dielectric layer pairs is formed on the substrate by replacing, through the slit, the sacrificial layers in the dielectric/sacrificial layer pairs with a plurality of conductor layers.

In another example, a method for forming a 3D memory device is disclosed. A dielectric stack including a plurality of dielectric/sacrificial layer pairs is formed on a substrate. A channel structure extending vertically through the dielectric stack is formed. A dummy channel structure extending vertically through the dielectric stack is formed. A first opening through the dielectric stack and a second opening outside of the dielectric stack are simultaneously etched. A first spacer on a sidewall of the first opening and a second spacer on a sidewall of the second opening are simultaneously formed. A conductor layer is deposited (i) filling in the first opening to form a TAC and (ii) filling in the second opening to form a peripheral contact. A slit extending vertically through the dielectric stack is formed after forming the TAC and peripheral device. A memory stack including a plurality of conductor/dielectric layer pairs is formed on the substrate by replacing, through the slit, the sacrificial layers in the dielectric/sacrificial layer pairs with a plurality of conductor layers.

In still another example, a method for forming a 3D memory device is disclosed. A dielectric stack including a plurality of dielectric/sacrificial layer pairs is formed on a substrate. A channel structure extending vertically through the dielectric stack is formed. A first opening through the dielectric stack, a second opening outside of the dielectric stack, and a third opening through the dielectric stack are simultaneously etched. A lateral dimension of the third opening is smaller than lateral dimensions of the first and second openings. A dielectric layer is deposited (i) fully filling in the third opening to form a dummy channel structure and (ii) partially filling in the first opening and the second opening. Parts of the dielectric layer that are deposited on a bottom surface of the first opening and on a bottom surface of the second opening are removed. A conductor layer is deposited (i) filling in the first opening to form a TAC and (ii) filling in the second opening to form a peripheral contact. A slit extending vertically through the dielectric stack is formed after forming the TAC and peripheral device. A memory stack including a plurality of conductor/dielectric layer pairs is formed on the substrate by replacing, through the slit, the sacrificial layers in the dielectric/sacrificial layer pairs with a plurality of conductor layers.

In a different example, a 3D memory device includes a substrate, a memory stack on the substrate including a plurality of conductor/dielectric layer pairs, a channel structure extending vertically through the conductor/dielectric layer pairs in the memory stack, a TAC extending vertically through the conductor/dielectric layer pairs in the memory stack, and a dummy channel structure fully filled with a dielectric layer and extending vertically through the conductor/dielectric layer pairs in the memory stack.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2E illustrate an exemplary fabrication process for forming channel structures of a 3D memory device, according to some embodiments of the present disclosure.

Figure 1:
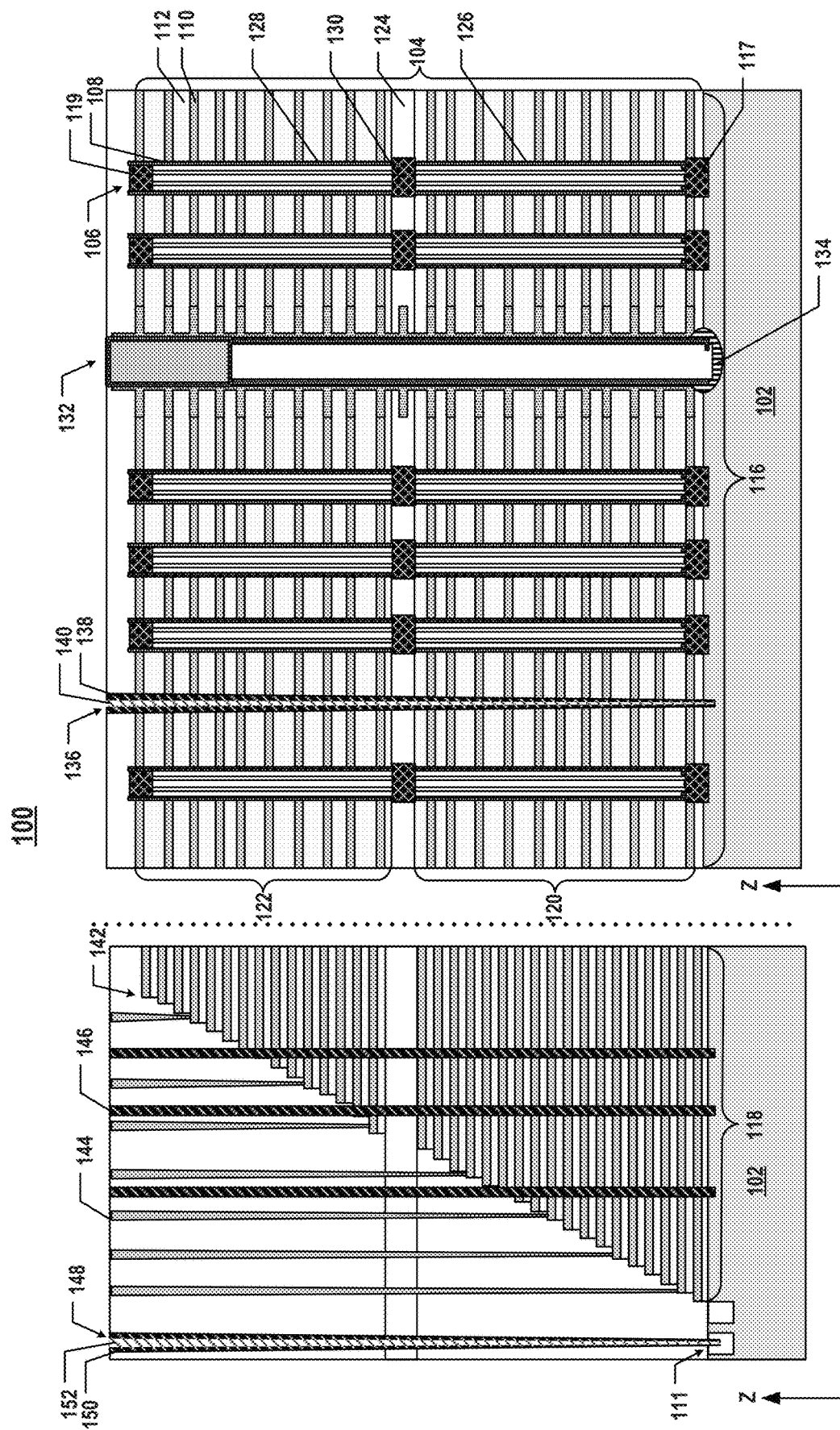
FIG. 1 illustrates a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, interconnects can include through array contacts (TACs) for providing vertical interconnects between the stacked memory array device and peripheral device (e.g., for power bus and metal routing), thereby reducing metal levels and shrinking die size. TACs can be formed within barrier structures, which preserves a dielectric stack region within a memory stack for ease of etching the openings of the TACs. However, the regions enclosed by the barrier structures take up large area in the core array region where memory strings can be formed and also have a negative impact on the resistance of word lines. Moreover, the existing fabrication processes for forming the barrier structures become more challenging for the next-generation 3D memory devices (e.g., having 128 levels or more), which have less process margin.

Various embodiments in accordance with the present disclosure provide a 3D memory device having TACs not enclosed by barrier structures, which resolves the above-noted issues associated with the barrier structures. For example, by removing the barrier structures, the areas for TACs can be reduced while keeping their functions, thereby increasing memory cell density and decreasing process cost. More process margin can also be obtained due to the elimination of etching and alignment steps for making the barrier structures, which enables high process extendibility for both current and future generations of 3D memory devices. Moreover, various embodiments of methods for forming the 3D memory device disclosed herein can allow TACs to be formed in the same fabrication process(es) for making other structures (e.g., peripheral contacts and/or dummy channel structures) and thus, further simplify the fabrication flow and reduce process cost.

FIG. 1 illustrates a cross-section of an exemplary 3D memory device 100, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate (e.g., a semiconductor layer), which was thinned from a normal thickness by grinding, wet/dry etching, chemical mechanical polishing (CMP), or any combination thereof.

3D memory device 100 can include a memory stack 104 above substrate 102. Memory stack 104 can be a stacked storage structure through which memory strings (e.g., NAND memory strings 106) are formed. In some embodiments, memory stack 104 includes a plurality of conductor/dielectric layer pairs stacked vertically above substrate 102. Each conductor/dielectric layer pair can include a conductor layer 110 and a dielectric layer 112. That is, memory stack 104 can include interleaved conductor layers 110 and dielectric layers 112 stacked vertically. As shown in FIG. 1, each NAND memory string 106 extends vertically through interleaved conductor layers 110 and dielectric layers 112 in memory stack 104. In some embodiments, 3D memory device 100 is a NAND Flash memory device in which memory cells are provided at intersections of NAND memory strings 106 and conductor layers 110 (functioning as word lines) of 3D memory device 100. The number of conductor/dielectric layer pairs in memory stack 104 (e.g., 32, 64, 96, or 128) can set the number of memory cells in 3D memory device 100.

Conductor layers 110 can each have the same thickness or have different thicknesses. Similarly, dielectric layers 112 can each have the same thickness or have different thicknesses. Conductor layers 110 can include conductive materials including, but not limited to, tungsten (W), cobalt (Co), copper (Cu), aluminum (Al), polycrystalline silicon (polysilicon), doped silicon, silicides, or any combination thereof. Dielectric layers 112 can include dielectric materials including, but not limited to, silicon oxide, silicon nitride, silicon oxynitride, or any combination thereof. In some embodiments, conductor layers 110 include metals, such as W, and dielectric layers 112 include silicon oxide. It is understood that a silicon oxide film (not shown), such as an in-situ steam generation (ISSG) silicon oxide, is formed between substrate 102 (e.g., a silicon substrate) and memory stack 104, according to some embodiments.

It is noted that x, y, and z axes are added to FIG. 1 to further illustrate the spatial relationship of the components in 3D memory device 100. The x-, y-, and z-directions are perpendicular to one another. Substrate 102 includes two lateral surfaces (e.g., a top surface and a bottom surface) extending laterally in the x-direction and y-direction (the lateral direction) in the x-y plane. As used herein, whether one component (e.g., a layer or a device) is "on," "above," or "below" another component (e.g., a layer or a device) of a semiconductor device (e.g., 3D memory device 100) is determined relative to the substrate (e.g., substrate 102) of the semiconductor device in the z-direction (the vertical direction) when the substrate is positioned in the lowest plane of the semiconductor device in the z-direction. The same notion for describing spatial relationship is applied throughout the present disclosure.

In some embodiments, 3D memory device 100 is part of a monolithic 3D memory device, in which the components of the monolithic 3D memory device (e.g., memory cells and peripheral devices) are formed on a single substrate (e.g., substrate 102). Peripheral devices 111, such as any suitable digital, analog, and/or mixed-signal peripheral circuits used for facilitating the operation of 3D memory device 100, can be formed on substrate 102 as well, outside of memory stack 104. Peripheral device 111 can be formed "on" substrate 102, where the entirety or part of peripheral device 111 is formed in substrate 102 (e.g., below the top surface of substrate 102) and/or directly on substrate 102. Peripheral device 111 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Isolation regions (e.g., shallow trench isolations (STIs)) and doped regions (e.g., source regions and drain regions of the transistors) can be formed in substrate 102 as well, outside of memory stack 104.

As shown in FIG. 1, memory stack 104 can include an inner region 116 (also known as a "core array region") and an outer region 118 (also known as a "staircase region"). In some embodiments, inner region 116 is the center region of memory stack 104 where an array of NAND memory strings 106 are formed through the conductor/dielectric layer pairs, and outer region 118 is the remaining region of memory stack 104 surrounding inner region 116 (including the sides and edges) without NAND memory strings 106.

As shown in FIG. 1, each NAND memory string 106 can include a channel structure 108 extending vertically through the conductor/dielectric layer pairs in inner region 116 of memory stack 104. Channel structure 108 can include a channel hole filled with semiconductor materials (e.g., forming a semiconductor channel) and dielectric materials (e.g., forming a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap/storage layer"), and a blocking layer. Each NAND memory string 106 can have a cylinder shape (e.g., a pillar shape). The semiconductor channel, tunneling layer, storage layer, and blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 106 include a plurality of control gates (each being part of a word line/conductor layer 110) for NAND memory strings 106. Conductor layer 110 in each conductor/dielectric layer pair can function as a control gate for memory cells of NAND memory string 106. Conductor layer 110 can include multiple control gates for multiple NAND memory strings 106 and can extend laterally as a word line ending in outer region 118 of memory stack 104.

In some embodiments, NAND memory string 106 includes two plugs 117 and 119 at a respective end in the vertical direction. Each plug 117 or 119 can be in contact with a respective end of channel structure 108. Plug 117 can include a semiconductor material, such as silicon, that is epitaxially grown from substrate 102. Plug 117 can function as the channel controlled by a source select gate of NAND memory string 106. Plug 117 can be at the lower end of NAND memory string 106 and in contact with channel structure 108 (e.g., on the upper end of channel structure 108). As used herein, the "upper end" of a component (e.g., NAND memory string 106) is the end father away from substrate 102 in the z-direction, and the "lower end" of the component (e.g., NAND memory string 106) is the end closer to substrate 102 in the z-direction when substrate 102 is positioned in the lowest plane of 3D memory device 100.

Plug 119 can include semiconductor materials (e.g., polysilicon) or conductor materials (e.g., metals). In some embodiments, plug 119 includes an opening filled with titanium/titanium nitride (Ti/TiN as a barrier layer) and tungsten (as a conductor). By covering the upper end of channel structure 108 during the fabrication of 3D memory device 100, plug 119 can function as an etch stop layer to prevent etching of dielectrics filled in channel structure 108, such as silicon oxide and silicon nitride. In some embodiments, plug 119 functions as the drain of NAND memory string 106.

In some embodiments, memory stack 104 includes a lower memory deck 120 disposed on substrate 102 and an upper memory deck 122 disposed above lower memory deck 120. A joint layer 124 can be disposed vertically between and electrically isolate lower memory deck 120 and upper memory deck 122. Each of lower and upper memory deck 120 and 122 can have the same or different number of conductor/dielectric layer pairs. Joint layer 124 can include dielectrics, such as silicon oxide. By separating memory stack 104 into lower and upper memory decks 120 and 122, or even more memory decks in some embodiments, channel structure 108 of NAND memory string 106 can be jointed by multiple channel structures, each of which is separately formed through a respective memory deck, to increase process yield. As shown in FIG. 1, channel structure 108 of NAND memory sting 106 includes a lower channel structure 126 extending vertically through lower memory deck 120 and an upper channel structure 128 extending vertically through upper memory deck. In some embodiments, an inter-deck plug 130 is disposed vertically between and in contact with lower channel structure 126 and upper channel structure 128. Inter-deck plug 130 can include semiconductor materials, such as polysilicon, and joint (e.g., electrically connect) lower and upper channel structures 126 and 128 to form channel structure 108. That is, NAND memory string 106 can include plug 117, lower channel structure 126, inter-deck plug 130, upper channel structure 128, and plug 119 from bottom to top in this order.

In some embodiments, 3D memory device 100 further includes slit structures 132. Each slit structure 132 can extend vertically through the conductor/dielectric layer pairs in memory stack 104. Slit structure 132 can also extend laterally (e.g., in the y-direction) to separate memory stack 104 into multiple blocks. Slit structure 132 can include an opening (slit) filled with conductive materials including, but not limited to, tungsten (W), cobalt (Co), copper (Cu), aluminum (Al), silicides, or any combination thereof. Slit structure 132 can further include a spacer having dielectric materials, such as silicon oxide, laterally between the filled conductive materials and memory stack 104 to electrically insulate the filled conductive materials from surrounding conductor layers 110 in memory stack 104. As a result, slit structures 132 can separate 3D memory device 100 into multiple memory blocks and/or memory fingers.

In some embodiments, slit structure 132 functions as the source contact for NAND memory strings 106 in the same memory block or the same memory finger that share the same array common source. Slit structure 132 can thus be referred to as a "common source contact" of multiple NAND memory strings 106. In some embodiments, substrate 102 includes a doped region 134 (including p-type or n-type dopants at a desired doping level), and the lower end of slit structure 132 is in contact with doped region 134 of substrate 102. Slit structure 132 thus can electrically connect to NAND memory strings 106 by doped region 134.

As shown in FIG. 1, 3D memory device 100 further includes TACs 136 each extending vertically through the conductor/dielectric layer pairs in memory stack 104. Each TAC 136 can extend vertically through interleaved conductor layers 110 and dielectric layers 112. In some embodiments, TAC 136 can extend through the entire thickness of memory stack 104, (e.g., all the conductor/dielectric layer pairs in the vertical direction). In some embodiments, TAC 136 further extends through at least part of substrate 102. TAC 136 can carry electrical signals from and/or to 3D memory device 100, such as part of the power bus, with shorten interconnect routing. In some embodiments, TAC 136 can provide electrical connections between 3D memory device 100 and peripheral device 111 and/or between back-end-of-line (BEOL) interconnects (not shown) and peripheral device 111. TAC 136 can also provide mechanical support to memory stack 104.

TAC 136 can include a vertical opening through memory stack 104 and that is filled with filling materials. In some embodiments, TAC 136 includes a spacer 138 on a sidewall of the opening and a conductor layer 140 in contact with spacer 138 in the opening. Conductor layer 140 can include conductive materials, including, but not limited to, W, Co, Cu, Al, doped silicon, silicides, or any combination thereof. Spacer 138 can electrically insulate conductor layer 140 of TAC 136 from surrounding conductor layers 110 in memory stack 104. In some embodiments, TAC 136 has a substantially circular shape in the plan view, and conductor layer 140 and spacer 138 are disposed radially from the center of TAC 136 in this order. Spacer 138 of TAC 136 can include dielectric materials including, but not limited to, silicon oxide, silicon nitride, silicon oxynitride, or any combination thereof.

As shown in FIG. 1, at least on one side in the lateral direction (e.g., in the y-direction), outer region 118 of memory stack 104 can include a staircase structure 142. In some embodiments, another staircase structure (not shown) is disposed on the opposite side of memory stack 104 in the y-direction. Each "level" of staircase structure 142 can include one or more conductor/dielectric layer pairs, each including conductor layer 110 and dielectric layer 112. The top layer in each level of staircase structure 142 can be conductor layer 110 for interconnection in the vertical direction. In some embodiments, each two adjacent levels of staircase structure 142 are offset by a nominally same distance in the vertical direction and a nominally same distance in the lateral direction. For each two adjacent levels of staircase structure 142, the first level (and conductor layer and dielectric layer therein) that is closer to substrate 102 can extend laterally further than the second level (and conductor layer and dielectric layer therein), thereby forming a "landing area" on the first level for interconnection in the vertical direction.

Staircase structure 142 can be used for landing word line contacts 144 and/or for balancing load in certain processes during fabrication (e.g., etching and chemical mechanical polishing (CMP)) by dummy channel structures 146 therethrough. The lower end of each word line contact 144 can be in contact with top conductor layer 110 (word line) in a respective level of staircase structure 142 to individually address a corresponding word line of 3D memory device 100. Word line contact 144 can include an opening (e.g., a via hole or a trench) extending vertical through one or more dielectric layers and filled with conductive materials including, but not limited to, W, Co, Cu, Al, silicides, or any combination thereof.

Dummy channel structure 146 can extend vertically through memory stack 104 and have a vertical opening filled with the same materials as those in channel structure 108. Different from channel structures 108, a contact is not formed on dummy channel structure 146 to provide electrical connections with other components of 3D memory device 100, according to some embodiments. In some embodiments, dummy channel structure 146 is fully filled with dielectric materials including, but not limited to, silicon oxide, silicon nitride, silicon oxynitride, or any combination thereof. Thus, dummy channel structures 146 cannot be used for forming memory cells in 3D memory device 100. Instead, dummy channel structures 146 can provide mechanical support to the memory array structures, e.g., memory stack 104. Although dummy channel structures 146 are disposed in outer region 118 of memory stack 104 as shown in FIG. 1, it is understood that dummy channel structures 146 can be formed in inner region 116 of memory stack 104 as well. In some embodiments, dummy channel structure 146 is fully filled with a dielectric layer, such as a silicon oxide layer, and extends vertically through the conductor/dielectric layer pairs in memory stack 104, either in inner region 116 or in outer region 118.

As shown in FIG. 1, 3D memory device 100 can further include peripheral contacts 148 extending vertically through one or more dielectric layers and in contact with peripheral devices 111 outside of memory stack 104. Peripheral contact 148 can provide electrical connections with peripheral devices 111. Peripheral contact 148 can include a vertical opening filled with filling materials. In some embodiments, similar to TAC 136, peripheral contact 148 includes a spacer 150 on a sidewall of the opening and a conductor layer 152 in contact with spacer 150 in the opening. Conductor layer 152 can include conductive materials, including, but not limited to, W, Co, Cu, Al, doped silicon, silicides, or any combination thereof. In some embodiments, peripheral contact 148 has a substantially circular shape in the plan view, and conductor layer 152 and spacer 150 are disposed radially from the center of peripheral contact 148 in this order. Spacer 150 of peripheral contact 148 can include dielectric materials including, but not limited to, silicon oxide, silicon nitride, silicon oxynitride, or any combination thereof. In some embodiments, spacer 150 of peripheral contact 148 and spacer 138 of TAC 136 have nominally the same thickness in the lateral direction (e.g., radial direction). In some embodiments, both spacer 150 of peripheral contact 148 and spacer 138 of TAC 136 include silicon oxide.

It is understood that 3D memory device 100 can include additional components and structures not shown in FIG. 1 including, but not limited to, other local contacts and interconnects in one or more BEOL interconnect layers above memory stack 104 and/or below substrate 102.

Figure 3A:
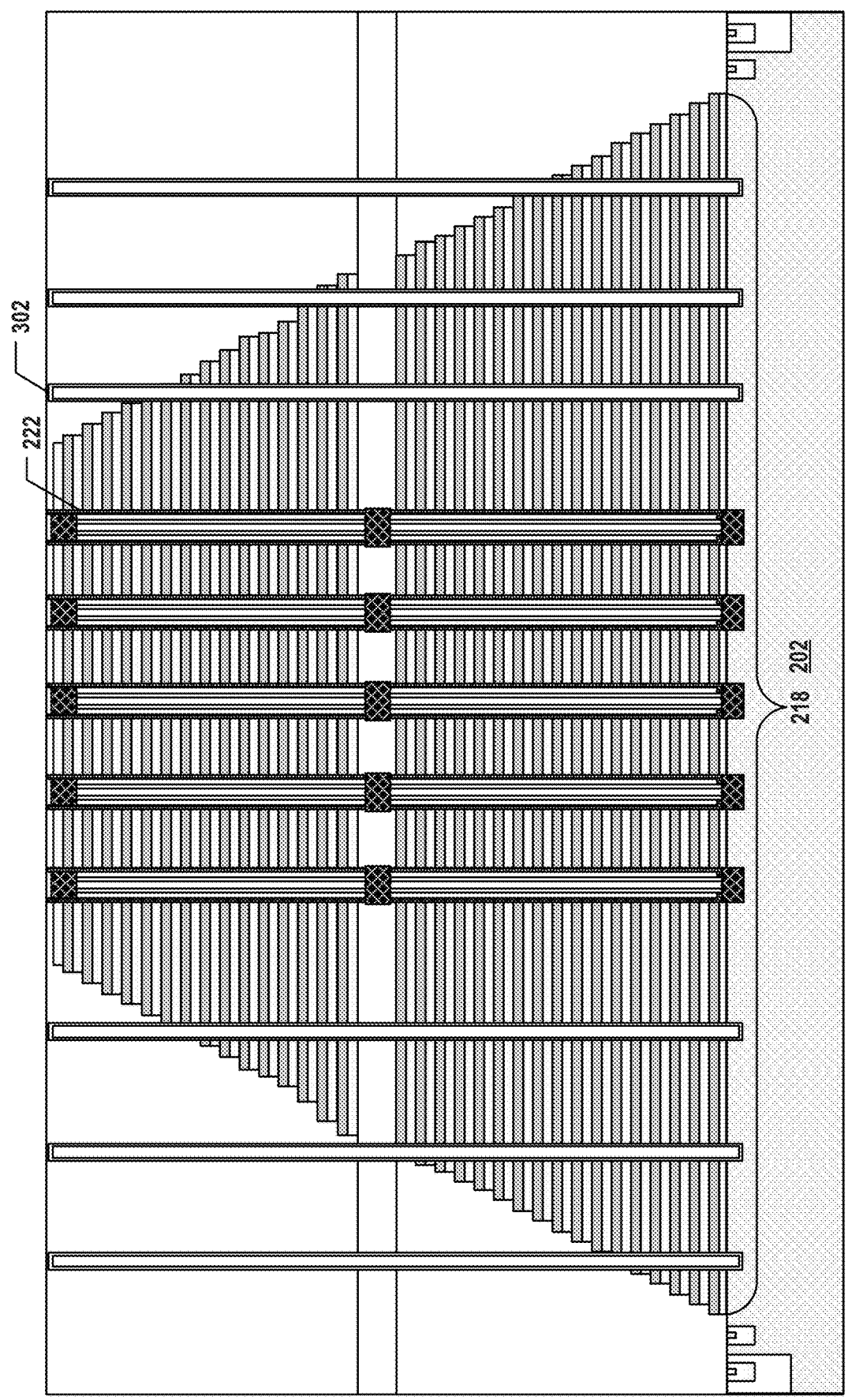
FIGS. 3A-3F illustrate exemplary fabrication processes for forming TACs, peripheral contacts, and dummy channel structures of a 3D memory device, according to various embodiments of the present disclosure.
Figure 3B:
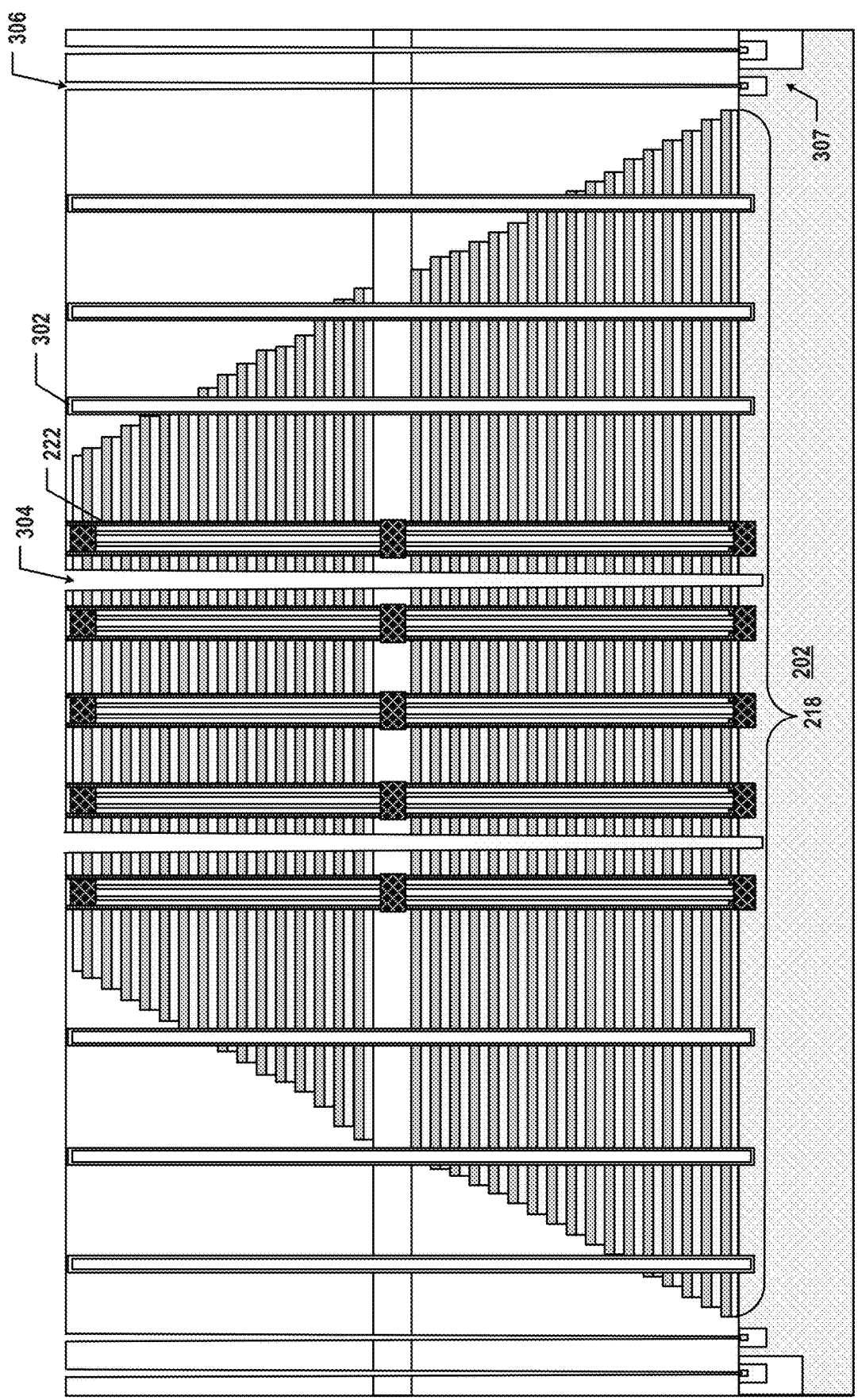
Figure 4A:
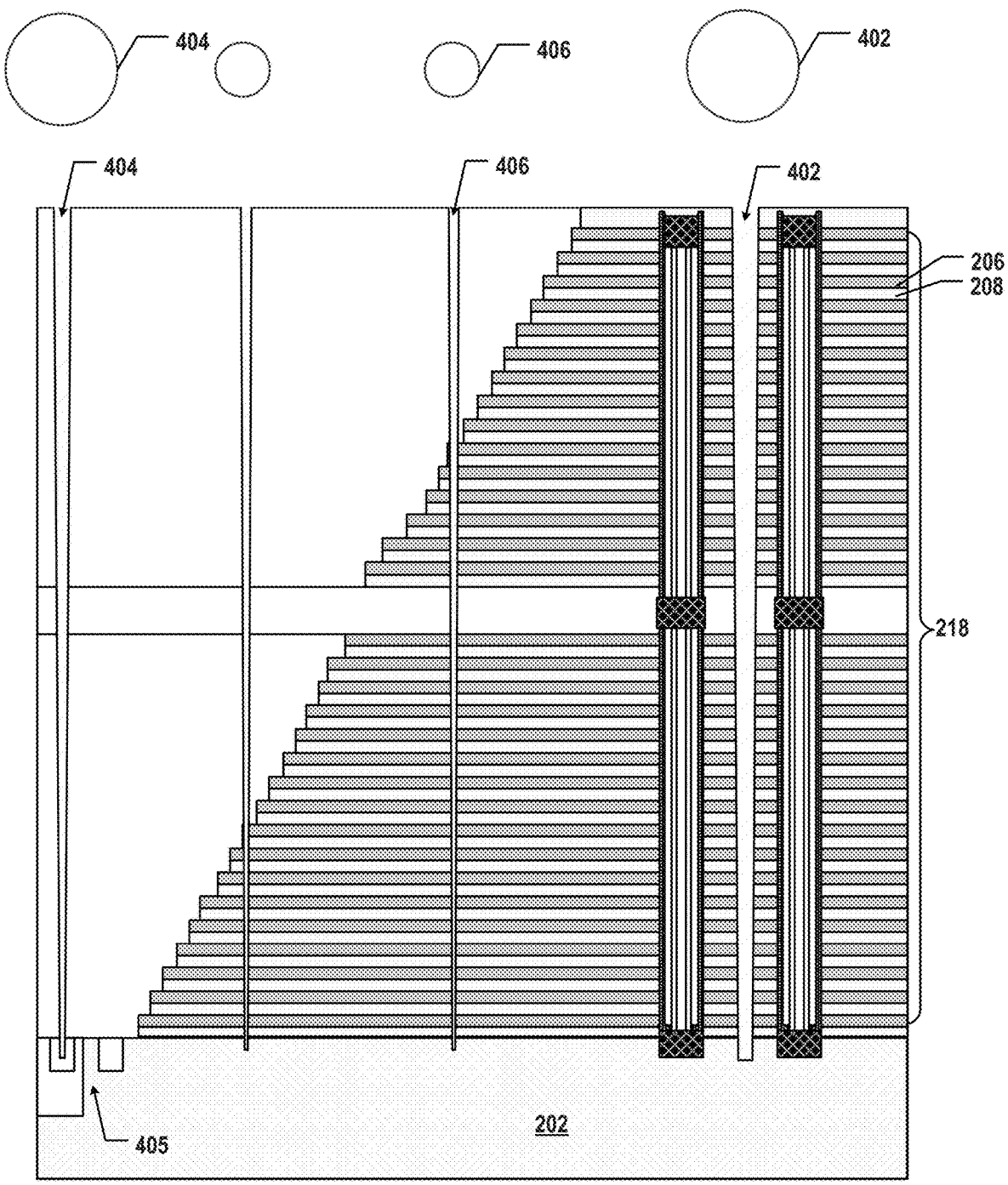
FIGS. 4A-4C illustrate another exemplary fabrication process for forming TACs, peripheral contacts, and dummy channel structures of a 3D memory device, according to some embodiments of the present disclosure.
Figure 4B:
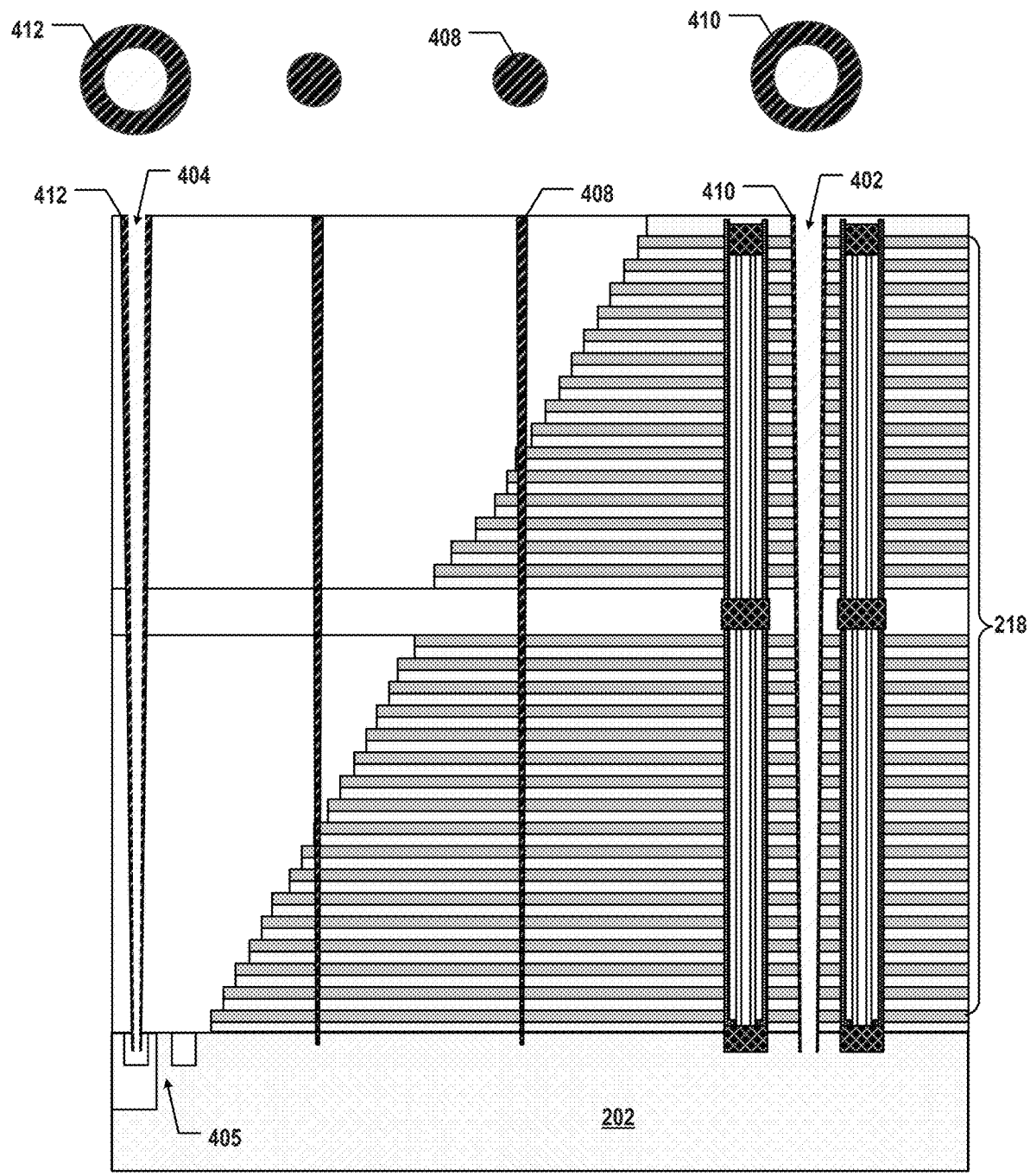
Figure 4C:
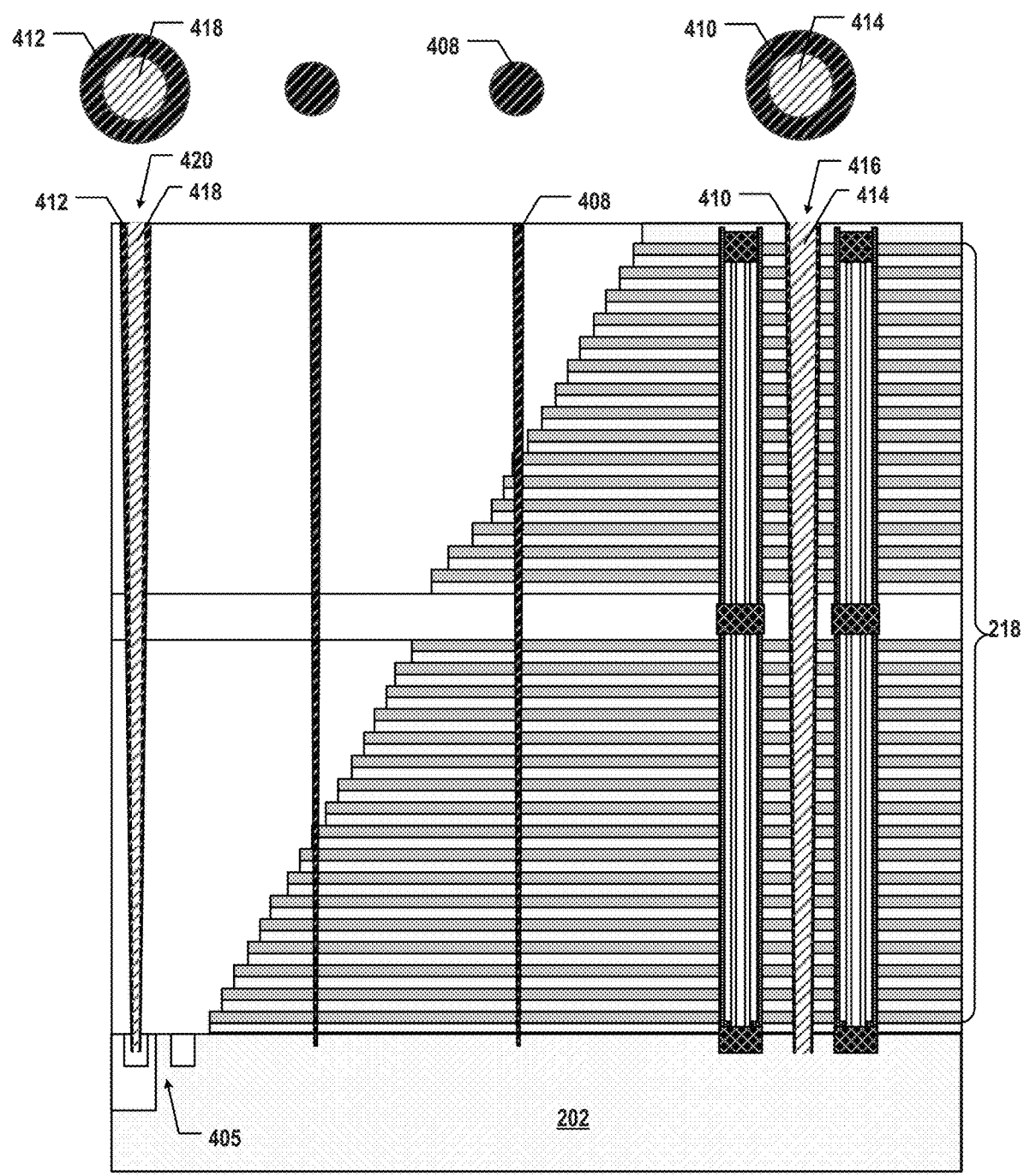
Figure 5A:
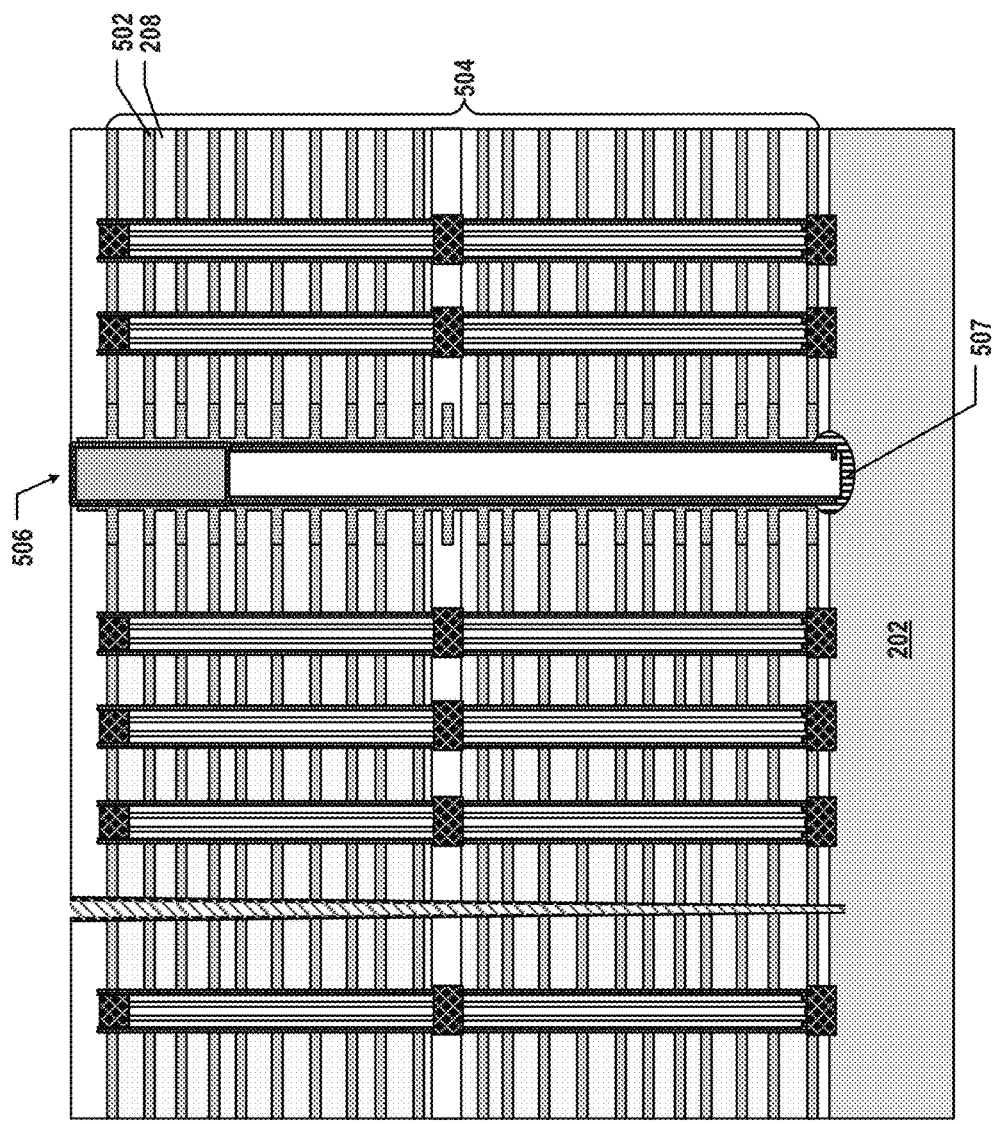
FIGS. 5A-5B illustrate an exemplary fabrication process for forming a slit structure and word line contacts of a 3D memory device, according to some embodiments of the present disclosure.
Figure 5A:
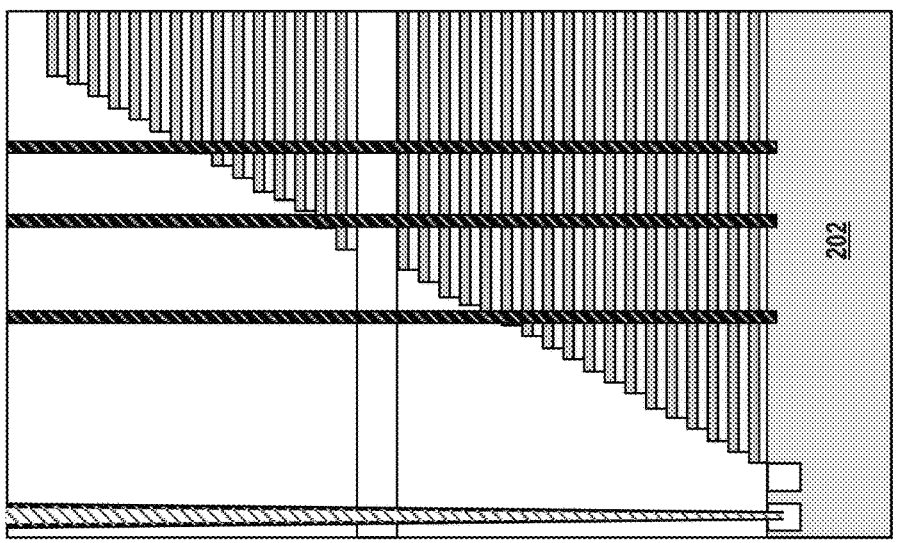
Figure 5B:
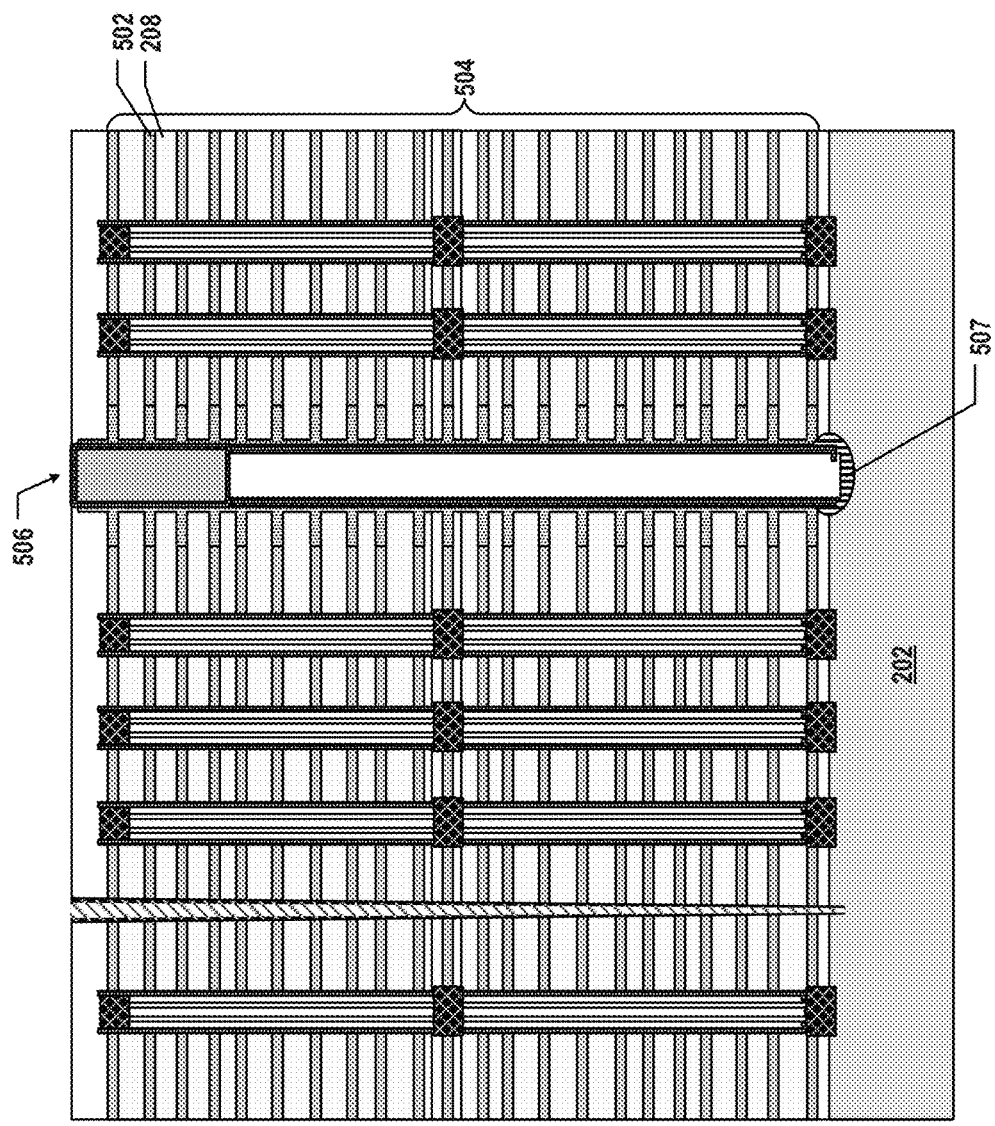
Figure 5B:
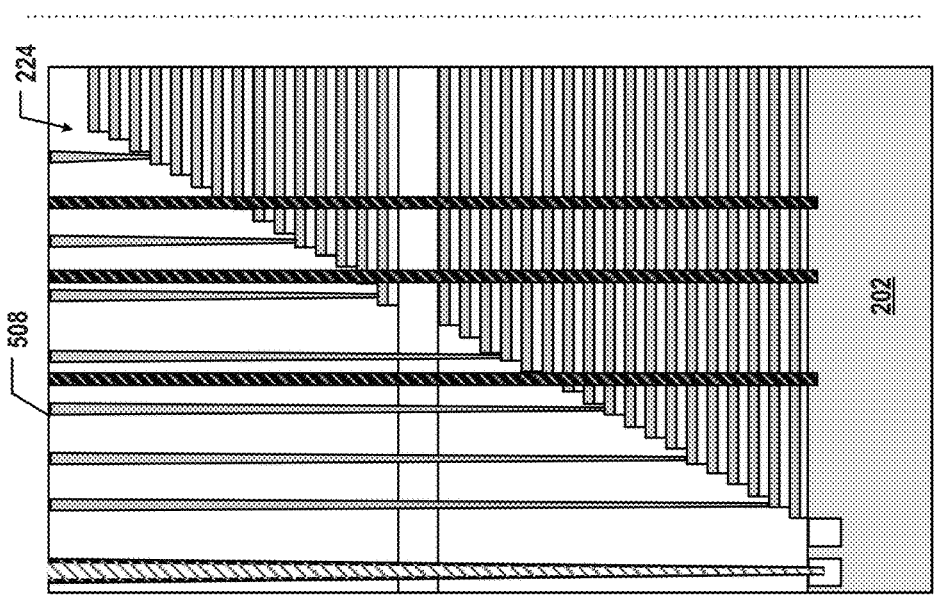
Figure 6:
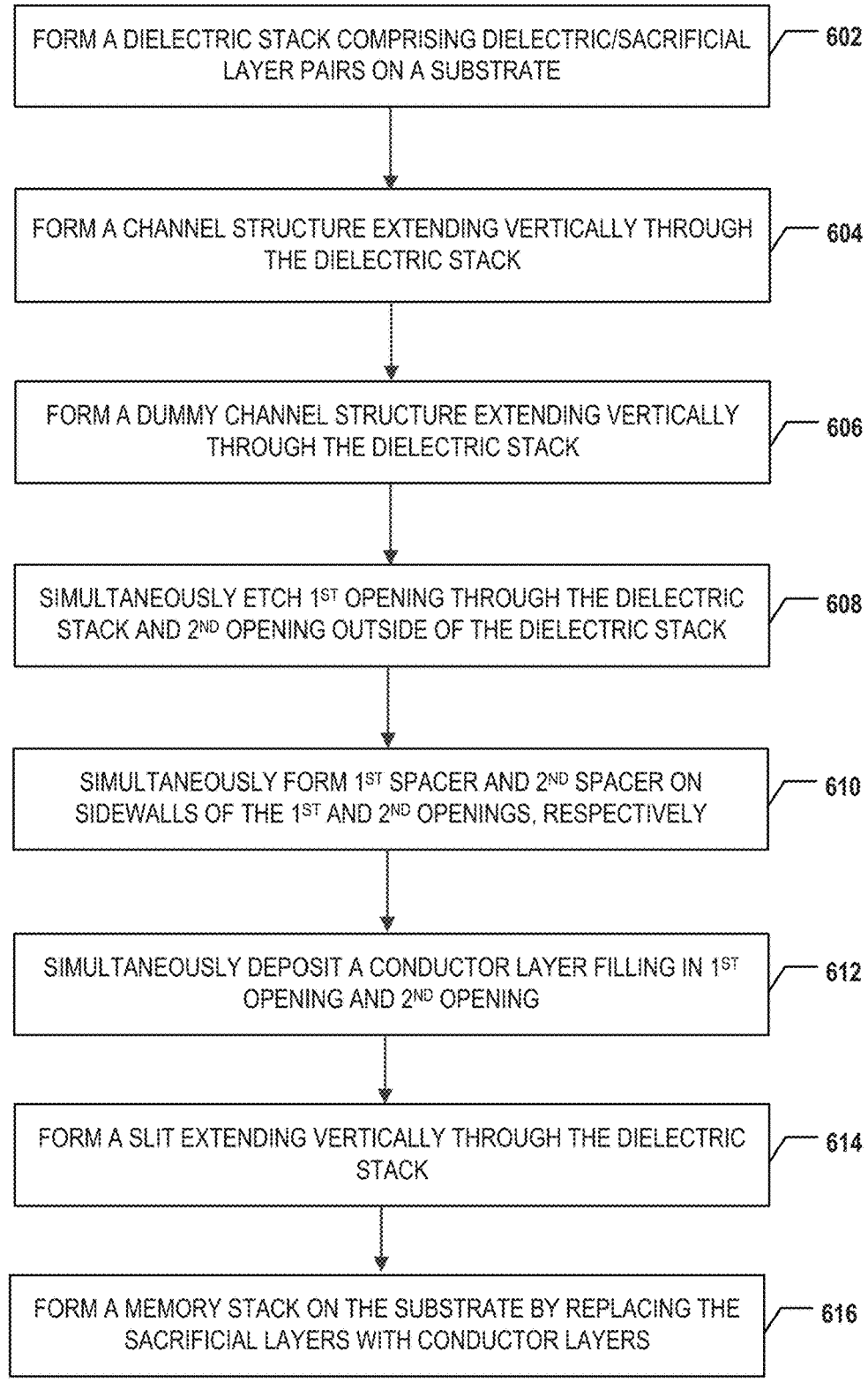
FIG. 6 is a flowchart of an exemplary method for forming a 3D memory device, according to some embodiments.
Figure 8:
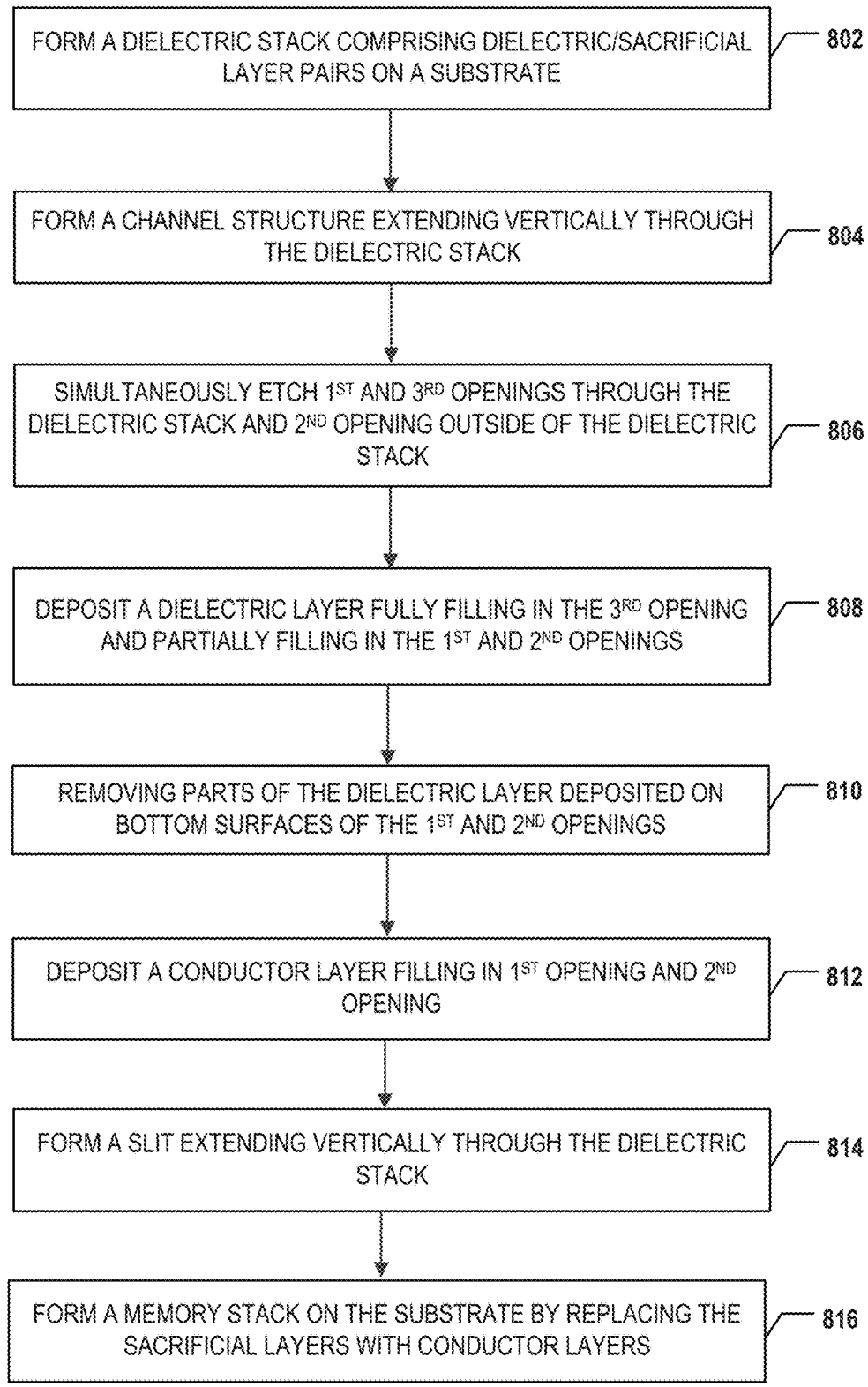
FIG. 8 is a flowchart of another exemplary method for forming a 3D memory device, according to some embodiments of the present disclosure.

FIGS. 2A-2E illustrate an exemplary fabrication process for forming channel structures of a 3D memory device, according to some embodiments of the present disclosure. FIGS. 3A-3F illustrate exemplary fabrication processes for forming TACs, peripheral contacts, and dummy channel structures of a 3D memory device, according to various embodiments of the present disclosure. FIGS. 4A-4C illustrate another exemplary fabrication process for forming TACs, peripheral contacts, and dummy channel structures of a 3D memory device, according to some embodiments of the present disclosure. FIGS. 5A-5B illustrate an exemplary fabrication process for forming a slit structure and word line contacts of a 3D memory device, according to some embodiments of the present disclosure. FIG. 6 is a flowchart of an exemplary method 600 for forming a 3D memory device, according to some embodiments. FIG. 8 is a flowchart of another exemplary method 800 for forming a 3D memory device, according to some embodiments of the present disclosure. Examples of the 3D memory device depicted in FIGS. 2-6 and 8 include 3D memory device 100 depicted in FIG. 1. FIGS. 2-6 and 8 will be described together. It is understood that the operations shown in methods 600 and 800 are not exhaustive and that other operations can be performed as well before, after, or between any of the illustrated operations. Further, some of the operations may be performed simultaneously, or in a different order than shown in FIGS. 6 and 8.

Referring to FIG. 6, method 600 starts at operation 602, in which a dielectric stack including a plurality of dielectric/sacrificial layer pairs is formed on a substrate. The substrate can be a silicon substrate. In some embodiments, a lower dielectric deck is formed first, followed by the formation of a joint layer. An upper dielectric deck can then be formed on the joint layer to form the dielectric stack. Method 600 proceeds to operation 604, as illustrated in FIG. 6, in which a channel structure extending vertically through the dielectric stack is formed. In some embodiments, a lower channel structure extending vertically through the lower dielectric deck is formed. An inter-deck plug can then be formed on the lower channel structure in the joint layer. Once the upper dielectric deck is formed, an upper channel structure extending vertically through the upper dielectric deck can be formed and jointed with the lower channel structure by the inter-deck plug, thereby forming the channel structure. In some embodiments, a staircase structure is formed at one side of the dielectric stack.

Figure 2A:
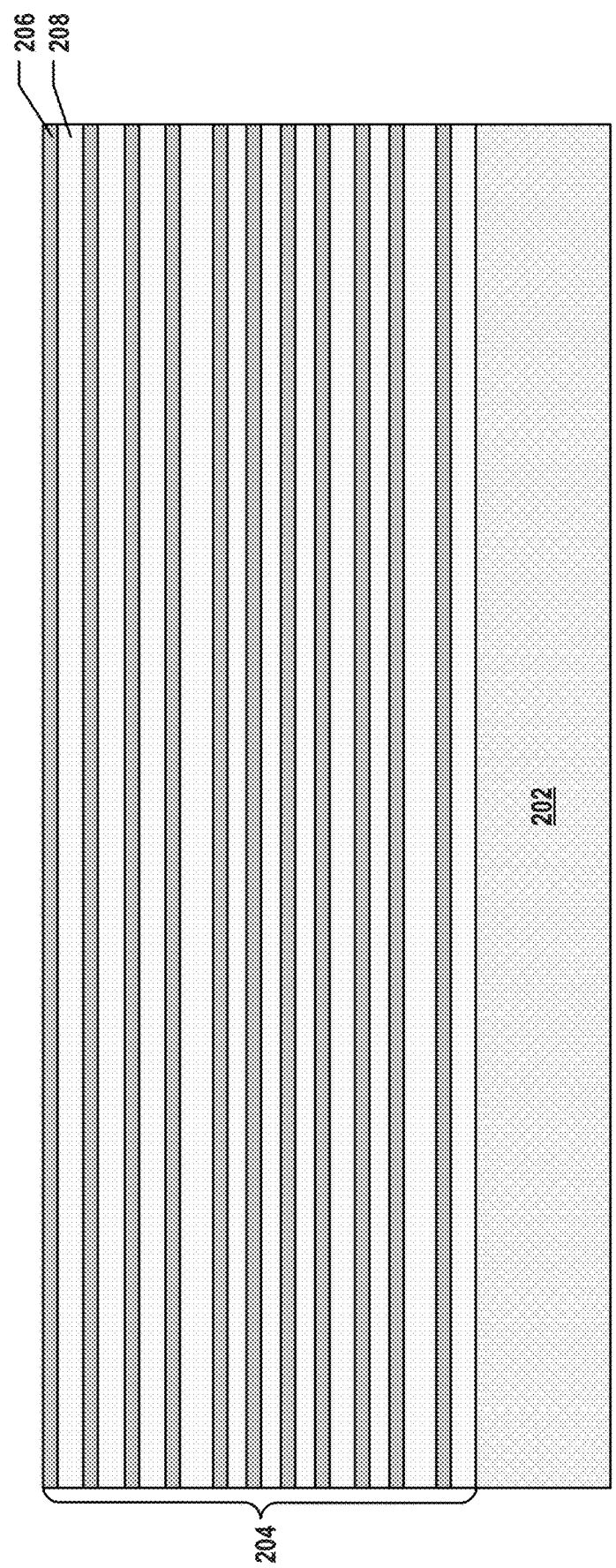

As illustrated in FIG. 2A, a lower dielectric deck 204 including a plurality of dielectric/sacrificial layer pairs is formed on a silicon substrate 202. In some embodiments, sacrificial layers 206 and dielectric layers 208 are alternatingly deposited by one or more thin film deposition processes including, but not limited to, physical vapor deposition (PVD), chemical vapor deposition (CVD), atomic layer deposition (ALD), or any combination thereof. In some embodiments, sacrificial layers 206 include silicon nitride, and dielectric layers 208 include silicon oxide. It is understood that the sequence of depositing sacrificial layers 206 and dielectric layers 208 is not limited. The deposition can start with sacrificial layer 206 or dielectric layer 208 and can end with sacrificial layer 206 or dielectric layer 208.

Figure 2B:
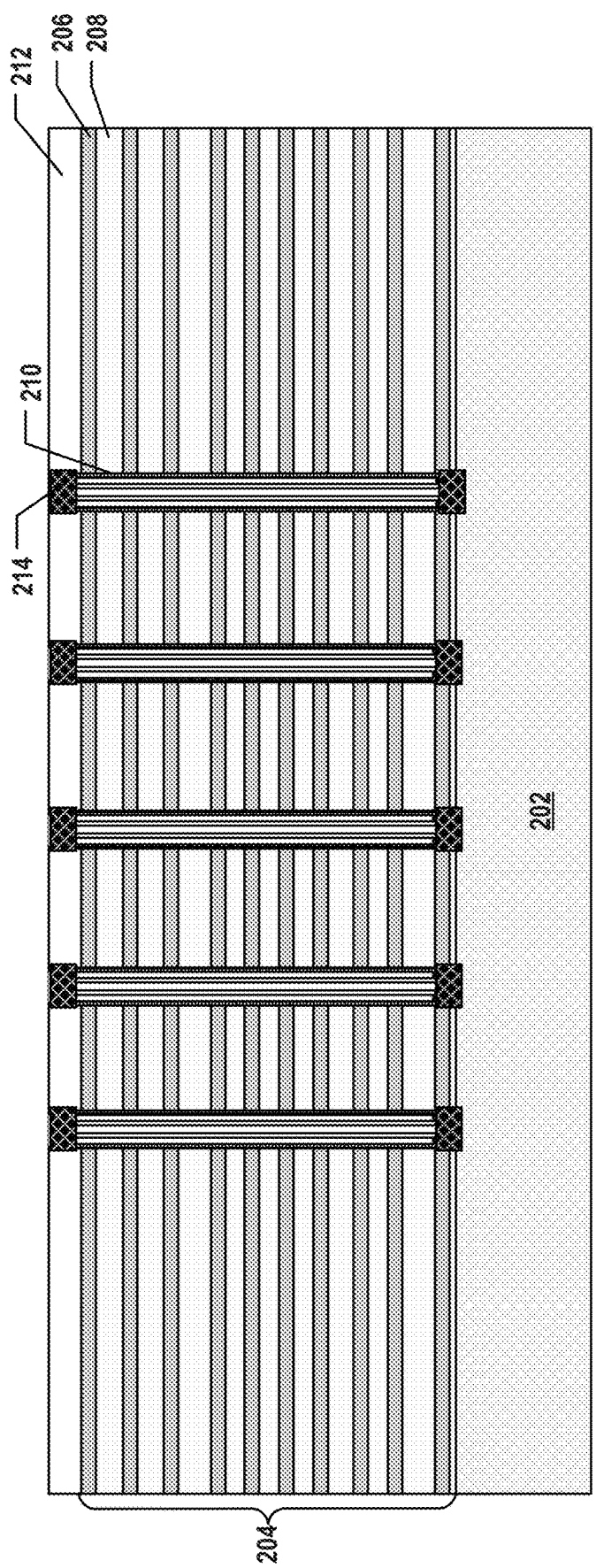

As illustrated in FIG. 2B, an array of lower channel structures 210 are formed, each of which extends vertically through interleaved sacrificial layers 206 and dielectric layers 208 in lower dielectric deck 204. In some embodiments, fabrication processes to form lower channel structure 210 include forming a channel hole through interleaved sacrificial layers 206 and dielectric layers 208 in lower dielectric deck 204 using dry etching/and or wet etching, such as deep reactive-ion etching (DRIE), followed by filling the channel hole with a plurality of layers, such as a dielectric layer and a semiconductor layer, using thin film deposition processes. In some embodiments, the dielectric layer is a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an aluminum oxide ($Al_2O_3$) layer. The semiconductor layer can include polysilicon, serving as a semiconductor channel. The semiconductor layer and dielectric layer can be formed by processes such as ALD, CVD, PVD, or any combination thereof.

As illustrated in FIG. 2B, a joint layer 212 is formed on lower dielectric deck 204 by depositing a dielectric layer, such as a silicon oxide layer, using thin film deposition processes, such as ALD, CVD, PVD, or any combination thereof. An array of inter-deck plugs 214 are formed in joint layer 212 and in contact with array of lower channel structures 210, respectively. Inter-deck plugs 214 can be formed by patterning and etching openings through joint layer 212, followed by deposition of semiconductor materials, such as polysilicon, using thin film deposition processes, such as ALD, CVD, PVD, or any combination thereof.

As illustrated in FIG. 2C, an upper dielectric deck 216 is formed on joint layer 212 and above lower dielectric deck 204. A dielectric stack 218 including lower dielectric deck 204 and upper dielectric deck 216 can thus be formed. The same fabrication processes for forming lower dielectric deck 204 can be used for forming upper dielectric deck 216 and thus, are not repeated again.

Figure 2D:
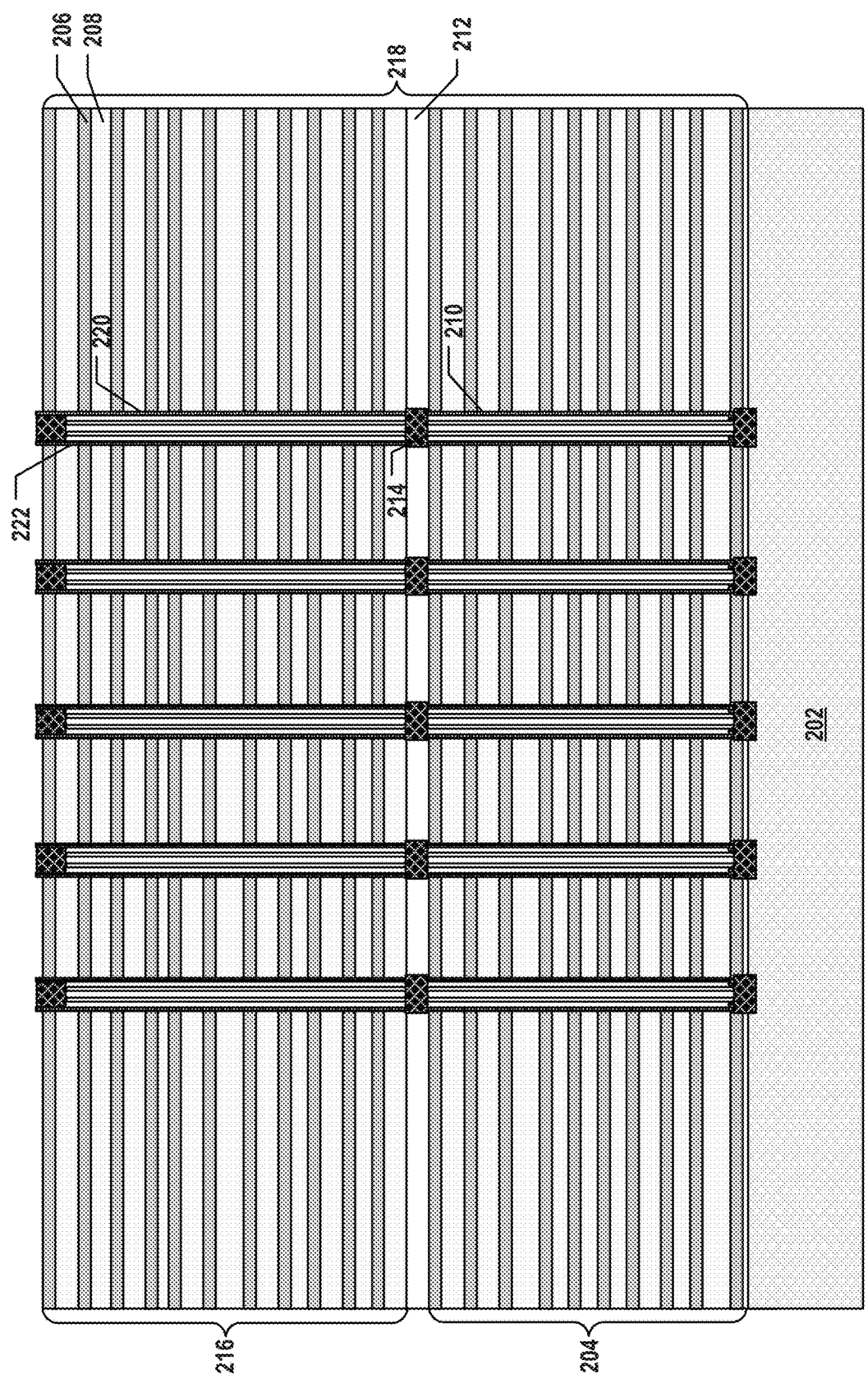

As illustrated in FIG. 2D, an array of upper channel structures 220 each extending vertically through upper dielectric deck 216 are formed and in contact with array of inter-deck plugs 214, respectively. An array of channel structures 222 each including lower channel structure 210 and upper channel structure 220 that are electrically connected by inter-deck plug 214 are thus formed. The same fabrication processes for forming lower channel structures 210 can be used for forming upper channel structures 220 and thus, are not repeated.

Figure 2E:
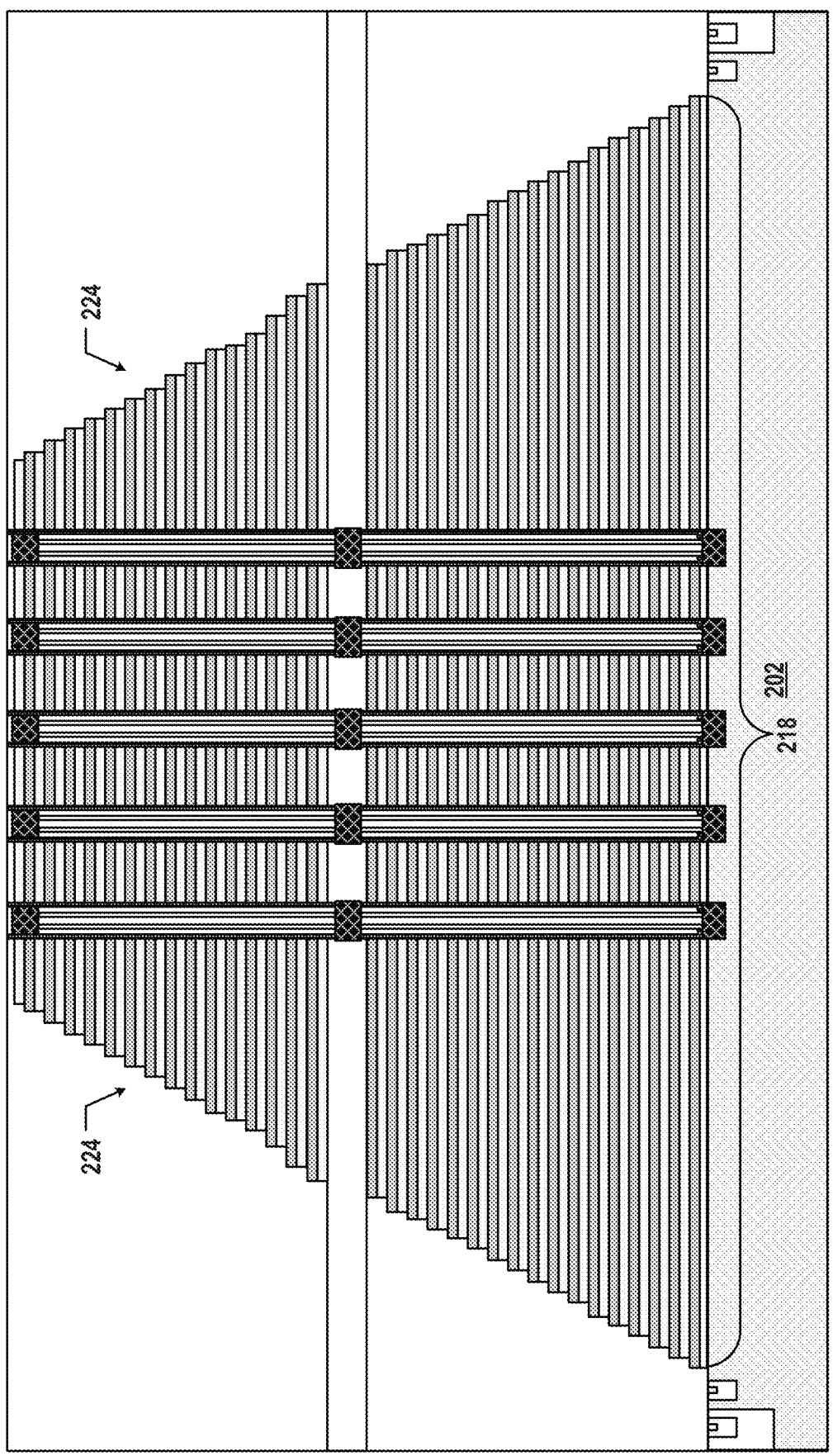

As illustrated in FIG. 2E, staircase structures 224 are formed on the sides of dielectric stack 218. Staircase structure 224 can be formed by the so-called "trim-etch" processes, which, in each cycle, trim (e.g., etching incrementally and inwardly, often from all directions) a patterned photoresist layer, followed by etching the exposed portions of the dielectric/sacrificial layer pair using the trimmed photoresist layer as an etch mask to form one step of staircase structure 224.

Method 600 proceeds to operation 606, as illustrated in FIG. 6, in which a dummy channel structure extending vertically through the dielectric stack is formed. As illustrated in FIG. 3A, an array of dummy channel structures 302 are formed through dielectric layer 218. Dummy channel structure 302 can be formed by first etching an opening through dielectric stack 218 and/or one or more dielectric layers using wet etching and/or dry etching, such as DRIE. In some embodiments, the opening is then fully filled with a dielectric layer, such as a silicon oxide layer, using one or more thin film deposition processes, such as ALD, CVD, PVD, or any combination thereof. In some embodiments, dummy channel structures 302 are formed simultaneously with channel structures 222 in the same fabrication steps, such that the opening of each dummy channel structure 302 is filled with at least some of the materials filling in channel structures 222.

Method 600 proceeds to operation 608, as illustrated in FIG. 6, in which a first opening through the dielectric stack and a second opening outside of the dielectric stack are simultaneously etched. As illustrated in FIG. 3B, first openings (TAC holes) 304 each extending vertically through the dielectric/sacrificial layer pairs in dielectric stack 218 are formed by wet etching and/or drying etching of interleaved dielectric layers 208 and sacrificial layers 206 (e.g., silicon nitride and silicon oxide). In some embodiments, TAC holes 304 are etched using DRIE. Second openings (peripheral contact holes) 306 can be simultaneously formed by the same wet etching and/or drying etching process, such as DRIE, to etch through one or more dielectric layers (e.g., silicon oxide and/or silicon nitride) outside of dielectric stack 218. The depths of TAC hole 304 and peripheral contact hole 306 in the vertical direction can be nominally the same. The lateral dimensions of TAC hole 304 and peripheral contact hole 306, such as the diameters, can be nominally the same or different in various embodiments. For example, the diameter of TAC hole 304 is greater than the diameter of peripheral contact hole 306, according to some embodiments.

As shown in FIG. 3B, TAC hole 304 and peripheral contact hole 306 can reach to silicon substrate 202, and the lower end of peripheral contact hole 306 can be in contact with a peripheral device 307 formed on silicon substrate 202. In some embodiments, peripheral device 307 includes transistors, which can be formed by a plurality of processes including, but not limited to, photolithography, dry/wet etch, thin film deposition, thermal growth, implantation, CMP, and any other suitable processes. In some embodiments, doped regions are formed in silicon substrate 202 by ion implantation and/or thermal diffusion, which function, for example, as source regions and/or drain regions of the transistors. In some embodiments, isolation regions (e.g., STIs) are also formed in silicon substrate 202 by wet etching and/or dry etching and thin film deposition processes. The fabrication process for forming peripheral device 307 can occur at any fabrication stage prior to the etching of peripheral contact hole 306.

Figure 7A:
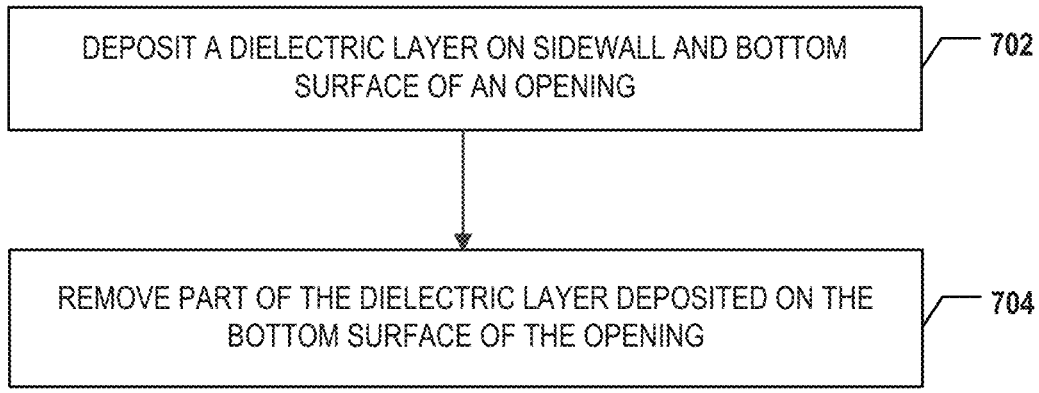
FIG. 7A is a flowchart of an exemplary method for forming a spacer on a sidewall of an opening, according to some embodiments of the present disclosure.

Method 600 proceeds to operation 610, as illustrated in FIG. 6, in which a first spacer and a second spacer are simultaneously formed on sidewalls of the first opening and the second opening, respectively. FIG. 7A is a flowchart of an exemplary method for forming a spacer on a sidewall of an opening, according to some embodiments. Referring to FIG. 7A, at operation 702, to form the first spacer, a dielectric layer is deposited on the sidewall and bottom surface of the first opening. At operation 704, part of the dielectric layer that is deposited on the bottom surface of the first opening is removed. The deposition of the dielectric layer can include ALD, and the removal of the part of the dielectric layer can include anisotropic etching on the bottom surface of the first opening.

Figure 3C:
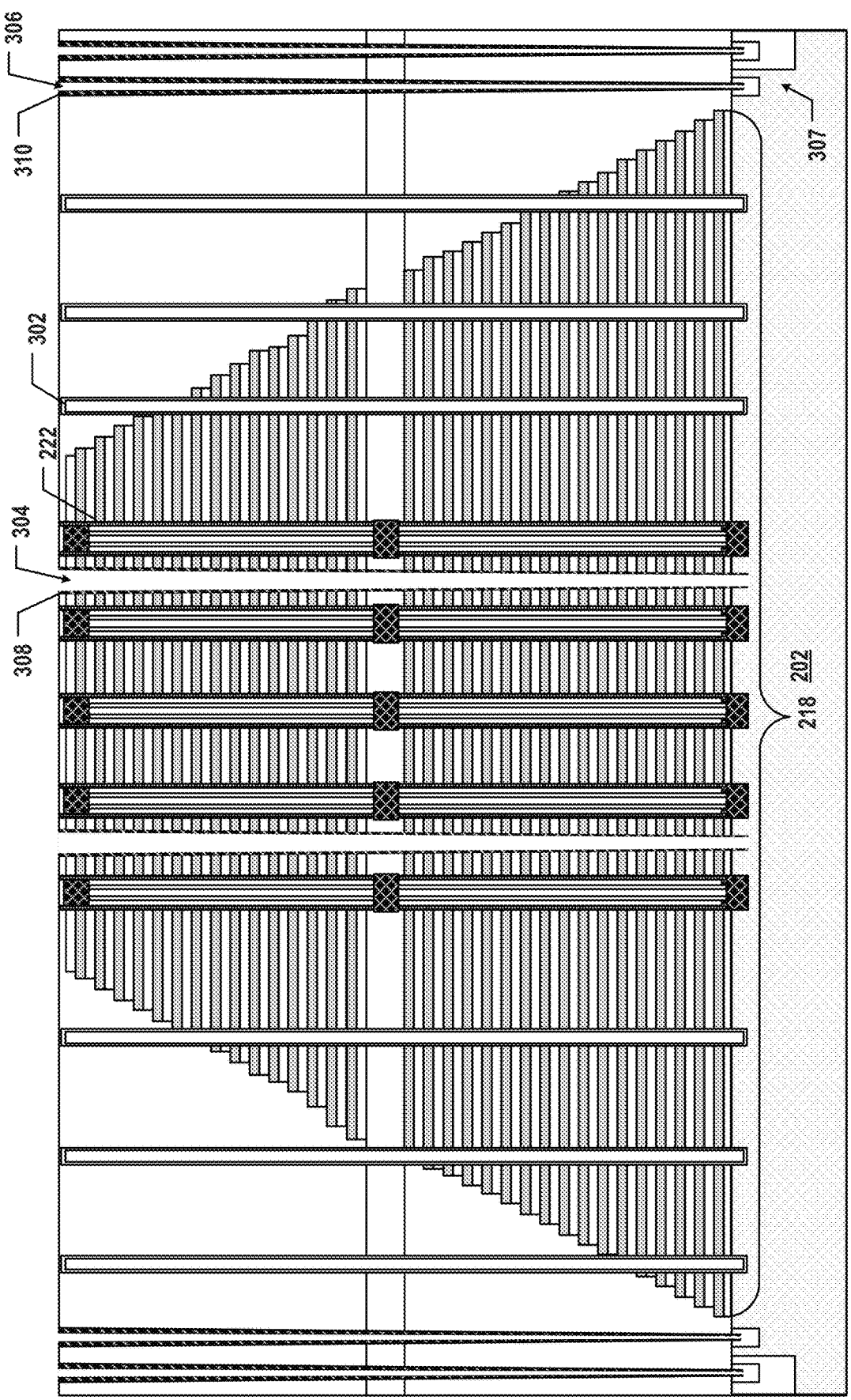

As illustrated in FIG. 3C, a first spacer 308 is formed on the sidewall, but not the bottom surface, of TAC hole 304. A dielectric layer can be first deposited into TAC hole 304 using one or more thin film deposition processes, such as ALD, CVD, PVD, or any combination thereof, which covers the sidewall and bottom surface of TAC hole 304. The part of the dielectric layer deposited on the bottom surface, but not on the sidewall, of TAC hole 304 can then be etched through using "bottom punch" processes. In some embodiments, a silicon oxide layer can be deposited on the sidewall and bottom surface of TAC hole 304 using ALD, and the part of the silicon oxide layer deposited on the bottom surface of TAC hole 304 can be removed using any suitable anisotropic etching directed to the bottom surface of TAC hole 304. In one example, a bias with a sufficient voltage level may be added to DRIE to etch through the silicon oxide layer on the bottom surface, but not through the sidewall, of TAC hole 304. Second spacer 310 can be simultaneously formed on the sidewall, but not the bottom surface, of peripheral contact hole 306, using the same deposition and bottom punch processes. In some embodiments, the thicknesses of first spacer 308 and second spacer 310 are nominally the same in the lateral direction (e.g., radial direction).

Figure 7B:
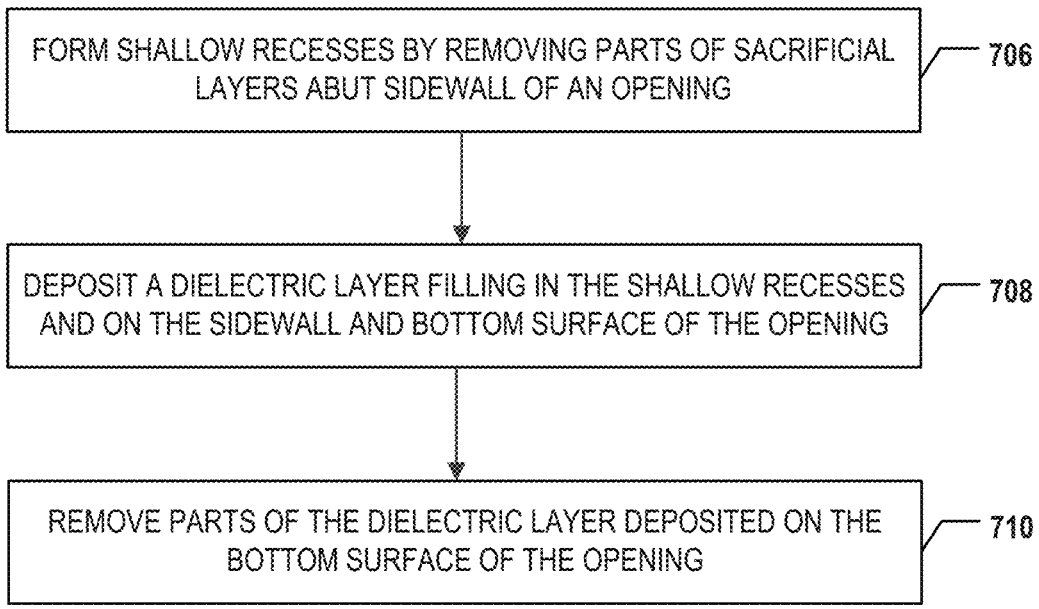
FIG. 7B is a flowchart of another exemplary method for forming a spacer on a sidewall of an opening, according to some embodiments of the present disclosure.

FIG. 7B is a flowchart of another exemplary method for forming a spacer on a sidewall of an opening, according to some embodiments. Referring to FIG. 7B, at operation 706, to form the first spacer on the sidewall of the first opening, a plurality of shallow recesses are first formed by removing parts of the sacrificial layers abutting the sidewall of the first opening. At operation 708, a dielectric layer is deposited filling in the shallow recesses and on the sidewall and a bottom surface of the first opening. At operation 710, part of the dielectric layer that is deposited on the bottom surface of the first opening is removed. The removal of the part of the dielectric layer includes isotropic etching on the sidewall and the bottom surface of the first opening, according to some embodiments.

Figure 3D:
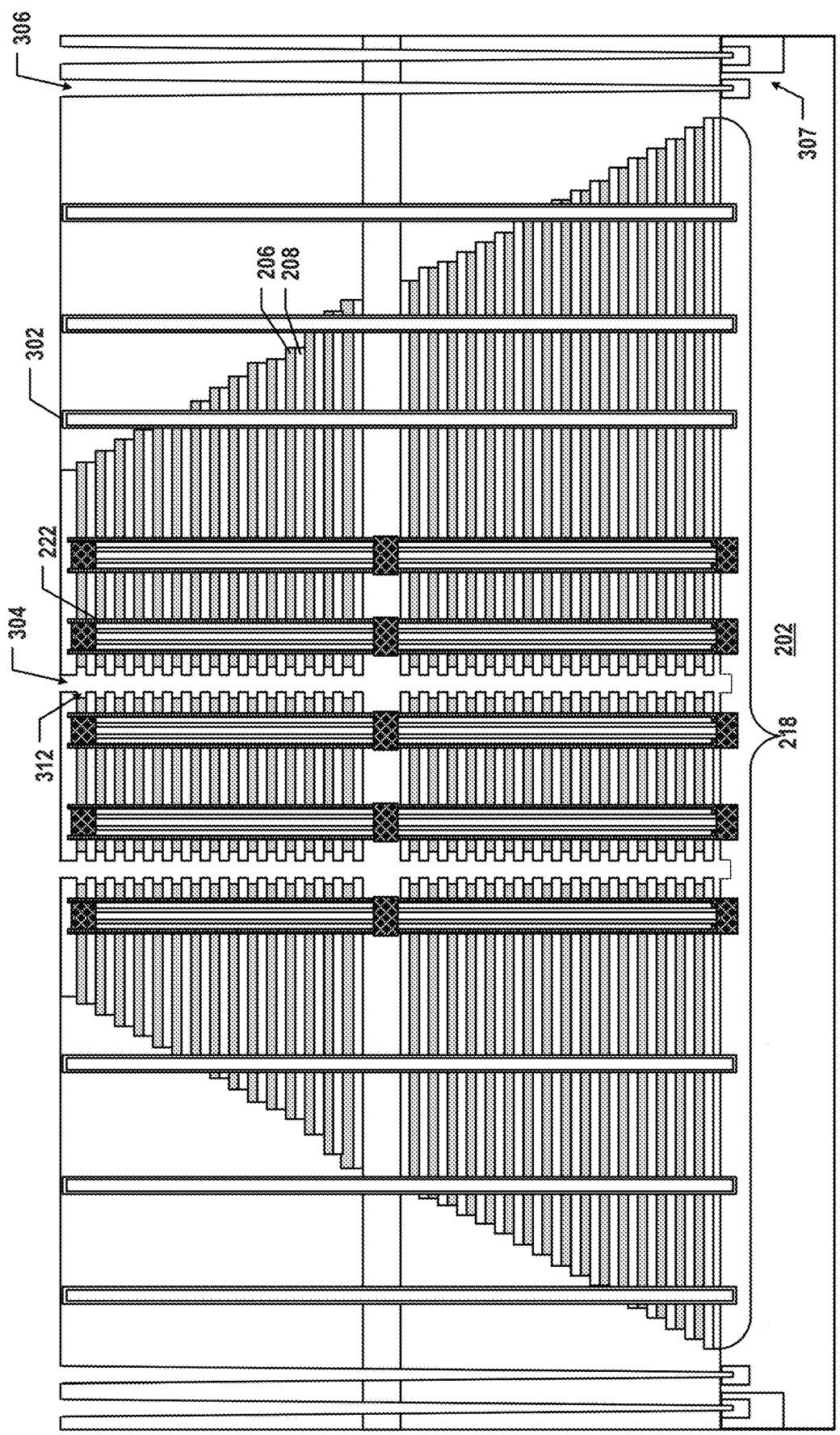
Figure 3E:
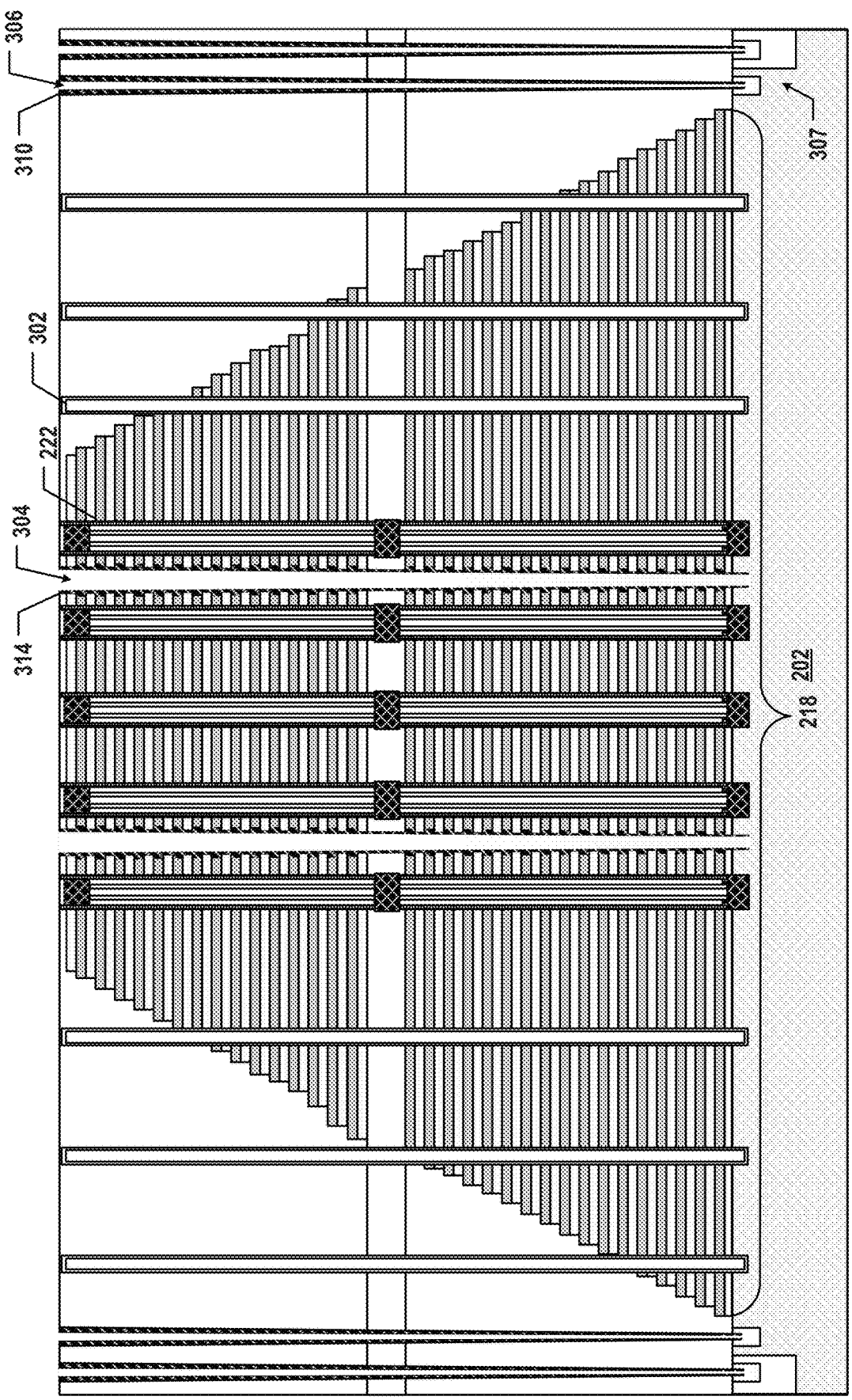

Different from the example illustrated in FIG. 3C in which first spacer 308 is formed by ALD deposition and bottom punch processes, FIGS. 3D-3E illustrate another example in which a first spacer 314 is formed by any deposition process, followed by an etch-back process. As illustrated in FIG. 3D, parts of sacrificial layers 206 in dielectric stack 218 that abut the sidewall of TAC hole 304 are removed by wet etching and/or dry etching, such as using a wet etchant for silicon nitride. A plurality of shallow recesses 312 can then be formed along the sidewall of TAC hole 304. The degree of the etching, i.e., the lateral dimension of shallow recess, can be controlled by the etching rate and/or etching time. The sacrificial layer partial removal process can provide space for a thicker dielectric layer deposition in the next step.

As illustrated in FIG. 3E, a first spacer 314 is formed on the sidewall, but not the bottom surface, of TAC hole 304. A dielectric layer can be first deposited into TAC hole 304 using one or more thin film deposition processes, such as ALD, CVD, PVD, or any combination thereof, which fills in shallow recesses 312 (as shown in FIG. 3D) and covers the sidewall and bottom surface of TAC hole 304. The part of the dielectric layer deposited on the bottom surface of TAC hole 304 can be then removed using etch-back processes. In some embodiments, isotropic etching can be applied to etch the dielectric layer deposited on both the sidewall and the bottom surface of TAC hole 304. Because the dielectric layer is substantially thicker along the sidewall (filling in shallow recesses 312) than on the bottom surface, when the part of the dielectric layer on the bottom surface has been etched through, the part of the dielectric layer on the sidewall can be partially etched, leaving first spacer 314 covering only the sidewall of TAC hole 304. In other words, the thickened dielectric layer along the sidewall is etched-back, leaving a thinner dielectric layer as first spacer 314, according to some embodiments. The etching rate and/or etching time of any suitable isotropic etching process can be controlled to fully etch through the dielectric layer on the bottom surface of TAC hole 304, but partially etch back the dielectric layer on the sidewall of TAC hole 304.

Figure 3F:
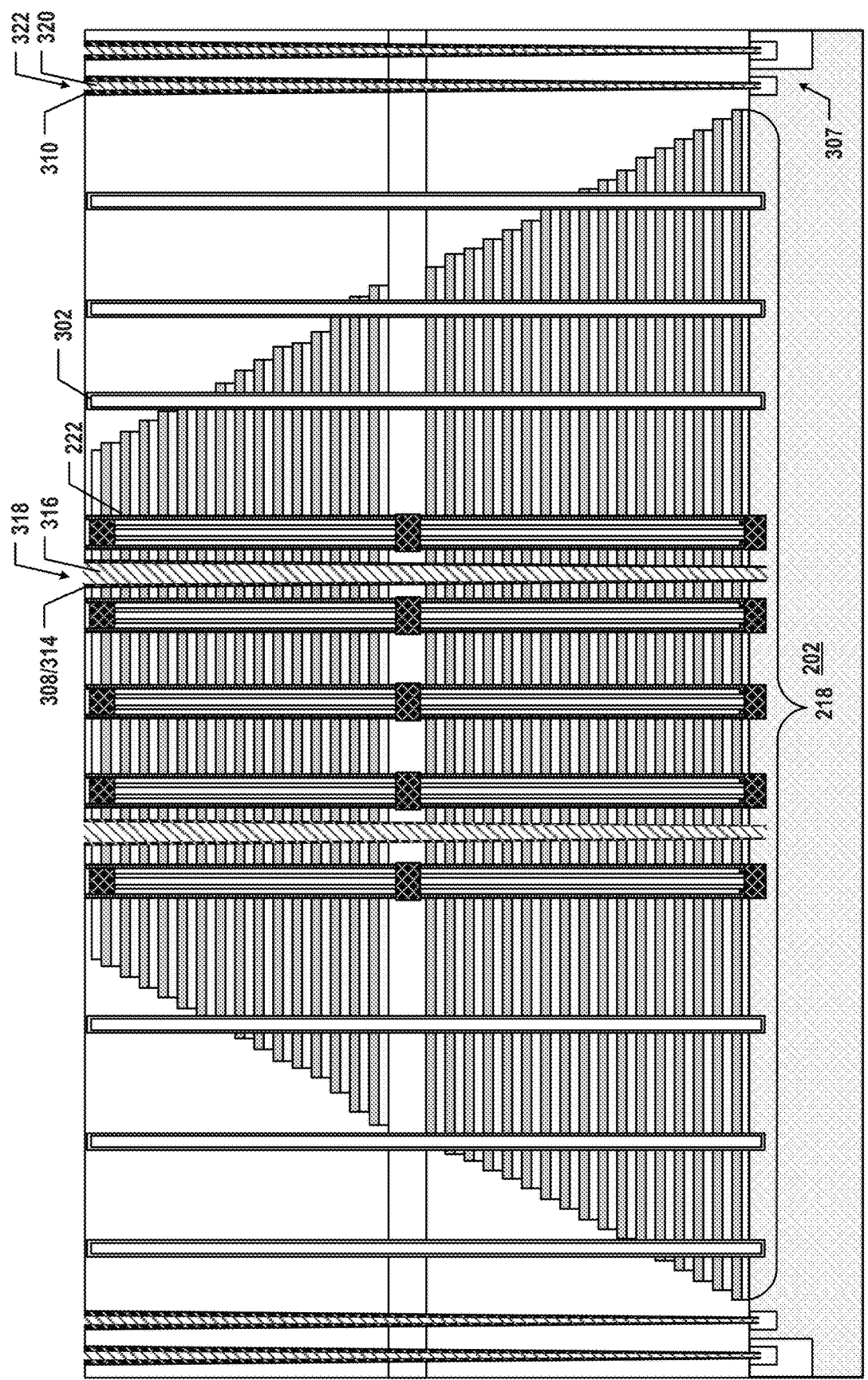

Method 600 proceeds to operation 612, as illustrated in FIG. 6, in which a conductor layer is deposited in the first opening to form a TAC and in the second opening to form a peripheral contact. In some embodiments, the conductor layer is a composite layer including an adhesion/barrier layer and a conductor. As illustrated in FIG. 3F, a conductor layer 316 is deposited in TAC hole 304 (as shown in FIGS. 3C-3E) to fill the remaining space of TAC hole 304, thereby forming a TAC 318 extending vertically through dielectric stack 218. In some embodiments, an adhesion/barrier layer is first formed along first spacer 308/314 by depositing titanium/titanium nitride (Ti/TiN) or titanium/tantalum nitride (Ta/TaN) using one or more thin film deposition processes, such as ALD, CVD, PVD, electrochemical depositions, or any combination thereof. A conductor can then be formed in the remaining space of TAC hole 304 by depositing metals, such as tungsten, using one or more thin film deposition processes, such as ALD, CVD, PVD, electrochemical depositions, or any combination thereof. A conductor layer 320 can be simultaneously formed in peripheral contact hole 306 (as shown in FIGS. 3C-3E) to form a peripheral contact 322 in contact with peripheral device 307, using the same deposition processes. The excess conductor layer after deposition can be removed by CMP.

Method 600 proceeds to operation 614, as illustrated in FIG. 6, in which a slit extending vertically through the dielectric stack is formed after the formation of the TAC. Method 600 proceeds to operation 616, as illustrated in FIG. 6, in which a memory stack including a plurality of conductor/dielectric layer pairs is formed on the substrate by replacing, through the slit, the sacrificial layers in the dielectric/sacrificial layer pairs with a plurality of conductor layers. In some embodiments, a slit structure is formed by depositing a conductor layer in the slit after the formation of the memory stack. In some embodiments, a plurality of word line contacts each in contact with a respective one of the conductor layers of the conductor/dielectric layer pairs in the staircase structure are formed.

As illustrated in FIG. 5A, an opening (slit) can be etched through the dielectric/sacrificial layer pairs in dielectric stack 218 (as shown in FIGS. 3-4). The slit can be formed by wet etching and/or dry etching of dielectrics (e.g., silicon oxide and silicon nitride). The opening can be used as the pathway for gate replacement processes that replace sacrificial layers 206 in dielectric stack 218 with conductor layers 502 to form a plurality of conductor/dielectric layer pairs. The replacement of sacrificial layers 206 with conductor layers 502 can be performed by wet etching sacrificial layers 206 (e.g., silicon nitride) selective to dielectric layers 208 (e.g., silicon oxide) and filling the structure with conductor layers 502 (e.g., W). Conductor layers 502 can be deposited by PVD, CVD, ALD, electrochemical depositions, or any combination thereof. Conductor layers 502 can include conductive materials including, but not limited to, W, Co, Cu, Al, polysilicon, silicides, or any combination thereof. As a result, after the gate replacement processes, dielectric stack 218 in FIGS. 3-4 becomes memory stack 504 including the conductor/dielectric layer pairs, i.e., interleaved conductor layers 502 and dielectric layers 208, on silicon substrate 202.

As illustrated in FIG. 5A, a slit structure 506 is formed by filling (e.g., depositing) conductive materials into the slit by PVD, CVD, ALD, electrochemical depositions, or any combination thereof. Slit structure 506 can include conductive materials including, but not limited to, W, Co, Cu, Al, polysilicon, silicides, or any combination thereof. In some embodiments, a dielectric layer (e.g., a silicon oxide layer) is formed first between the conductive materials of slit structure 506 and conductor layers 502 surrounding slit structure 506 as a spacer. The lower end of slit structure 506 can be in contact with a doped region 507, which can be formed in silicon substrate 202 using ion implantation and/or thermal diffusion.

As illustrated in FIG. 5B, each word line contact 508 is in contact with a respective one of conductor layers 502 of the conductor/dielectric layer pairs in staircase structure 224. Word line contacts 508 are formed through one or more dielectric layers by first etching vertical openings (e.g., by wet etching and/or dry etching), followed by filling the openings with conductive materials using ALD, CVD, PVD, electrochemical depositions, or any combination thereof. In some embodiments, other conductive materials are filled in the openings to function as an adhesion/barrier layer. Etching of dielectric layers to form the openings of word line contacts 508 can be controlled by etch stop at a different material. For example, etching of dielectric layers can be stopped when reaching to conductor layers 502 in staircase structure 224.

FIG. 8 is a flowchart of another exemplary method 800 for forming a 3D memory device, according to some embodiments of the present disclosure. Operations 802, 804, 814, and 816 are similar to operations 602, 604, 614, and 616, respectively, and thus are not repeated. Method 800 proceeds to operation 806, as illustrated in FIG. 8, in which a first opening through the dielectric stack, a second opening outside of the dielectric stack, and a third opening through the dielectric stack are simultaneously etched. In some embodiments, the lateral dimension (e.g., diameter) of the third opening is smaller than lateral dimensions of the first and second openings. Each of the first, second, and third openings has a nominally circular shape in the plan view, according to some embodiments.

As illustrated in FIG. 4A, a first opening (TAC hole) 402, a second opening (peripheral contact hole) 404, and a third opening (dummy channel hole) 406 are simultaneously formed, each of which reaches to silicon substrate 202. The lower end of peripheral contact hole 404 can be in contact with a peripheral device 405 formed on silicon substrate 202. TAC hole 402 and dummy channel hole 406 can be etched through interleaved sacrificial layers 206 and dielectric layers 208 (e.g., silicon nitride and silicon oxide) in dielectric stack 218 using wet etching and/or dry etching, and peripheral contact hole 404 can be simultaneously etched through one or more dielectric layers (e.g., silicon oxide) using the same wet etching and/or dry etching process. In some embodiments, TAC hole 402, peripheral contact hole 404, and dummy channel hole 406 are etched using DRIE at the same time. The depths of TAC hole 402, peripheral contact hole 404, and dummy channel hole 406 in the vertical direction can be nominally the same. In some embodiments, each of TAC hole 402, peripheral contact hole 404, and dummy channel hole 406 has a substantially circular shape in the plan view. The lateral dimensions (e.g., diameters) of TAC hole 402, peripheral contact hole 404, and dummy channel hole 406 can be controlled by patterning process and/or etching parameters, such as etching rate and etching time. In some embodiments, in the plan view, the diameter of dummy channel hole 406 is smaller than the diameter of TAC hole 402 and the diameter of peripheral contact hole 404. In some embodiments, the diameter of peripheral contact hole 404 is smaller than the diameter of TAC hole 402 in the plan view.

Method 800 proceeds to operation 808, as illustrated in FIG. 8, in which a dielectric layer is deposited (i) fully filling in the third opening to form a dummy channel structure and (ii) partially filling in the first opening and the second opening. Method 800 proceeds to operation 810, as illustrated in FIG. 8, in which parts of the dielectric layer deposited on the bottom surfaces of the first and second openings are removed.

As illustrated in FIG. 4B, a dielectric layer (e.g., silicon oxide) is deposited into TAC hole 402, peripheral contact hole 404, and dummy channel hole 406 using one or more thin film deposition processes, such as ALD, CVD, PVD, electrochemical depositions, or any combination thereof. Due to the different lateral dimensions of TAC hole 402, peripheral contact hole 404, and dummy channel hole 406, by controlling the deposition parameters, such as the deposition rate and/or deposition time, the deposited dielectric layer can fully fill in dummy channel hole 406 to form a dummy channel structure 408, but only partially fill in TAC hole 402 and peripheral contact hole 404 to form a first spacer 410 and a second spacer 412, respectively, on the sidewalls of TAC hole 402 and peripheral contact hole 404. Dummy channel structure 408 is thus formed extending vertically through dielectric stack 218. As described above, parts of the dielectric layer deposited on the bottom surfaces of TAC hole 402 and peripheral contact hole 404 can be removed (i.e., etched through) using the bottom punch process, such as high bias DRIE. As a result, first and second spacers 410 and 412 are formed on the sidewalls, but not the bottom surfaces, of TAC hole 402 and peripheral contact hole 404, respectively. In some embodiments, the simultaneously formed first and second spacers 410 and 412 have nominally the same thickness in the radial direction in the plan view.

Method 800 proceeds to operation 812, as illustrated in FIG. 8, in which a conductor layer is deposited (i) filling in the first opening to form a TAC and (ii) filling in the second opening to form a peripheral contact. As illustrated in FIG. 4C, a conductor layer 414 is deposited in TAC hole 402 (as shown in FIG. 4B) to fill the remaining space of TAC hole 402, thereby forming a TAC 416 extending vertically through dielectric stack 218. In some embodiments, an adhesion/barrier layer is first formed along first spacer 410 by depositing Ti/TiN or Ta/TaN using one or more thin film deposition processes, such as ALD, CVD, PVD, electrochemical depositions, or any combination thereof. A conductor can then be formed in the remaining space of TAC hole 402 by depositing metals, such as tungsten, using one or more thin film deposition processes, such as ALD, CVD, PVD, electrochemical depositions, or any combination thereof. A conductor layer 418 can be simultaneously formed in peripheral contact hole 404 (as shown in FIG. 4B) to form a peripheral contact 420 in contact with peripheral device 405, using the same deposition processes. The excess conductor layer after deposition can be removed by CMP.

According to one aspect of the present disclosure, a method for forming a 3D memory device is disclosed. A dielectric stack including a plurality of dielectric/sacrificial layer pairs is formed on a substrate. A channel structure extending vertically through the dielectric stack is formed. A first opening extending vertically through the dielectric stack is formed. A spacer is formed on a sidewall of the first opening. A TAC extending vertically through the dielectric stack is formed by depositing a conductor layer in contact with the spacer in the first opening. A slit extending vertically through the dielectric stack is formed after forming the TAC. A memory stack including a plurality of conductor/dielectric layer pairs is formed on the substrate by replacing, through the slit, the sacrificial layers in the dielectric/sacrificial layer pairs with a plurality of conductor layers.

In some embodiments, a staircase structure is formed at one edge of the dielectric stack prior to forming the first opening. A plurality of word line contacts each in contact with a respective one of the conductor layers of the conductor/dielectric layer pairs in the staircase structure are formed, according to some embodiments.

In some embodiments, a slit structure is formed by depositing a conductor layer in the slit.

In some embodiments, a dummy channel structure extending vertically through the dielectric stack is formed prior to forming the first opening.

In some embodiments, to form the first opening, the first opening through the dielectric stack and a second opening outside of the dielectric stack are simultaneously etched. In some embodiments, to form the TAC, the conductor layer is deposited in the first opening to form the TAC and in the second opening to form a peripheral contact.

In some embodiments, to form the spacer on the sidewall of first opening, a dielectric layer is deposited on the sidewall and a bottom surface of the first opening, and part of the dielectric layer that is deposited on the bottom surface of the first opening is removed. The deposition of the dielectric layer includes ALD, and the removal of the part of the dielectric layer includes anisotropic etching on the bottom surface of the first opening, according to some embodiments.

In some embodiments, to form the spacer on the sidewall of first opening, a plurality of shallow recesses are formed by removing parts of the sacrificial layers abut the sidewall of the first opening, a dielectric layer is deposited filling in the shallow recesses and on the sidewall and a bottom surface of the first opening, and part of the dielectric layer that is deposited on the bottom surface of the first opening is removed. The removal of the part of the dielectric layer includes isotropic etching on the sidewall and the bottom surface of the first opening, according to some embodiments.

In some embodiments, to form the first opening, the first opening through the dielectric stack, a second opening outside of the dielectric stack, and a third opening through the dielectric stack are simultaneously etched. A lateral dimension of the third opening can be smaller than lateral dimensions of the first and second openings.

In some embodiments, to form the spacer on the sidewall of the first opening, a dielectric layer is deposited (i) fully filling in the third opening to form a dummy channel structure and (2) partially filling in the first opening and the second opening, and parts of the dielectric layer that are deposited on a bottom surface of the first opening and on a bottom surface of the second opening are removed. Each of the first, second, and third openings can have a nominally circular shape in the plan view.

In some embodiments, the dielectric layers in the dielectric/sacrificial layer pairs include silicon oxide, the sacrificial layers in the dielectric/sacrificial layer pairs include silicon nitride, and the spacer includes silicon oxide.

According to another aspect of the present disclosure, a method for forming a 3D memory device is disclosed. A dielectric stack including a plurality of dielectric/sacrificial layer pairs is formed on a substrate. A channel structure extending vertically through the dielectric stack is formed. A dummy channel structure extending vertically through the dielectric stack is formed. A first opening through the dielectric stack and a second opening outside of the dielectric stack are simultaneously etched. A first spacer on a sidewall of the first opening and a second spacer on a sidewall of the second opening are simultaneously formed. A conductor layer is deposited (i) filling in the first opening to form a TAC and (ii) filling in the second opening to form a peripheral contact. A slit extending vertically through the dielectric stack is formed after forming the TAC and peripheral device. A memory stack including a plurality of conductor/dielectric layer pairs is formed on the substrate by replacing, through the slit, the sacrificial layers in the dielectric/sacrificial layer pairs with a plurality of conductor layers.

In some embodiments, a staircase structure is formed at one edge of the dielectric stack prior to forming the dummy channel structure. A plurality of word line contacts each in contact with a respective one of the conductor layers of the conductor/dielectric layer pairs in the staircase structure are formed, according to some embodiments.

In some embodiments, a slit structure is formed by depositing a conductor layer in the slit.

In some embodiments, to form the first spacer on the sidewall of the first opening, a dielectric layer is deposited on the sidewall and a bottom surface of the first opening, and part of the dielectric layer that is deposited on the bottom surface of the first opening is removed. The deposition of the dielectric layer includes ALD, and the removal of the part of the dielectric layer includes anisotropic etching on the bottom surface of the first opening, according to some embodiments.

In some embodiments, to form the spacer on the sidewall of first opening, a plurality of shallow recesses are formed by removing parts of the sacrificial layers abutting the sidewall of the first opening, a dielectric layer is deposited filling in the shallow recesses and on the sidewall and a bottom surface of the first opening, and part of the dielectric layer that is deposited on the bottom surface of the first opening is removed. The removal of the part of the dielectric layer includes isotropic etching on the sidewall and the bottom surface of the first opening, according to some embodiments.

In some embodiments, the dielectric layers in the dielectric/sacrificial layer pairs include silicon oxide, the sacrificial layers in the dielectric/sacrificial layer pairs include silicon nitride, and the first and second spacers include silicon oxide.

According to still another aspect of the present disclosure, a method for forming a 3D memory device is disclosed. A dielectric stack including a plurality of dielectric/sacrificial layer pairs is formed on a substrate. A channel structure extending vertically through the dielectric stack is formed. A first opening through the dielectric stack, a second opening outside of the dielectric stack, and a third opening through the dielectric stack are simultaneously etched. A lateral dimension of the third opening is smaller than lateral dimensions of the first and second openings. A dielectric layer is deposited (i) fully filling in the third opening to form a dummy channel structure and (ii) partially filling in the first opening and the second opening. Parts of the dielectric layer that are deposited on a bottom surface of the first opening and on a bottom surface of the second opening are removed. A conductor layer is deposited (i) filling in the first opening to form a TAC and (ii) filling in the second opening to form a peripheral contact. A slit extending vertically through the dielectric stack is formed after forming the TAC and peripheral device. A memory stack including a plurality of conductor/dielectric layer pairs is formed on the substrate by replacing, through the slit, the sacrificial layers in the dielectric/sacrificial layer pairs with a plurality of conductor layers.

In some embodiments, a staircase structure is formed at one edge of the dielectric stack prior to etching the first, second, and third openings. A plurality of word line contacts each in contact with a respective one of the conductor layers of the conductor/dielectric layer pairs in the staircase structure are formed, according to some embodiments.

In some embodiments, a slit structure is formed by depositing a conductor layer in the slit.

In some embodiments, each of the first, second, and third openings has a nominally circular shape in the plan view.

In some embodiments, the dielectric layers in the dielectric/sacrificial layer pairs includes silicon oxide, the sacrificial layers in the dielectric/sacrificial layer pairs includes silicon nitride, and the dielectric layer filling the first, second, and third openings include silicon oxide.

According to yet another aspect of the present disclosure, a 3D memory device includes a substrate, a memory stack on the substrate including a plurality of conductor/dielectric layer pairs, a channel structure extending vertically through the conductor/dielectric layer pairs in the memory stack, a TAC extending vertically through the conductor/dielectric layer pairs in the memory stack, and a dummy channel structure fully filled with a dielectric layer and extending vertically through the conductor/dielectric layer pairs in the memory stack.

In some embodiments, the 3D memory device further includes a peripheral device on the substrate, and a peripheral contact outside of the memory stack and in contact with the peripheral device.

In some embodiments, each of the TAC and peripheral contact includes a spacer with a nominally same thickness. The dielectric layer in the dummy channel structure and the spacers in the TAC and peripheral contact include silicon oxide, according to some embodiments.

In some embodiments, the 3D memory device further includes a lower memory deck on the substrate and an upper memory deck above the lower memory stack. In some embodiments, the channel structure includes a lower channel structure extending vertically through the lower memory deck, an upper channel structure extending vertically through the upper memory deck, and an inter-deck plug disposed vertically between and in contact with the lower channel structure and the upper channel structure.

In some embodiments, the 3D memory device further includes a staircase structure at one edge of the memory stack, and a plurality of word line contacts each in contact with a respective one of the conductor layers of the conductor/dielectric layer pairs in the staircase structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a substrate;
   a memory stack on the substrate comprising interleaved a plurality of conductive layers and dielectric layers, each of the plurality of conductive layers having a respective shallow recess;
   a channel structure extending vertically through the memory stack; and
   a through array contact (TAC) extending vertically through the memory stack,
   wherein the TAC comprises a conductor layer and a spacer in the plurality of shallow recesses abutting a sidewall of the TAC.

2. The 3D memory device of claim 1, wherein the spacer is further over the sidewall of the TAC.

3. The 3D memory device of claim 1, wherein the TAC is in an inner region of the memory stack.

4. The 3D memory device of claim 1, further comprising a dummy channel structure filled with a dielectric layer and extending vertically through the memory stack.

5. The 3D memory device of claim 4, wherein the dielectric layer in the dummy channel structure and the spacer in the TAC comprise silicon oxide.

6. The 3D memory device of claim 1, further comprising:
   a peripheral device on the substrate; and
   a peripheral contact outside of the memory stack and in contact with the peripheral device.

7. The 3D memory device of claim 1, further comprising a slit structure extending vertically through the memory stack.

8. The 3D memory device of claim 1, wherein the memory stack comprises:
   a lower memory deck on the substrate; and
   an upper memory deck above the lower memory deck.

9. The 3D memory device of claim 8, wherein the channel structure comprises:
- a lower channel structure extending vertically through the lower memory deck;
- an upper channel structure extending vertically through the upper memory deck; and
- an inter-deck plug disposed vertically between and in contact with the lower channel structure and the upper channel structure.

10. The 3D memory device of claim 1, further comprising:
- a staircase structure at one side of the memory stack; and
- a plurality of word line contacts each in contact with a respective one of the plurality of conductive layers in the staircase structure.

11. A three-dimensional (3D) memory device, comprising:
- a substrate;
- a memory stack on the substrate comprising interleaved a plurality of conductive layers and dielectric layers, none of the plurality of conductive layers having a shallow recess;
- a channel structure extending vertically through the memory stack; and
- a through array contact (TAC) extending vertically through the memory stack,
- wherein the TAC comprises a conductor layer and a spacer over a sidewall of the TAC.

12. The 3D memory device of claim 11, further comprising a dummy channel structure filled with a dielectric layer and extending vertically through the memory stack.

13. The 3D memory device of claim 11, further comprising:
- a peripheral device on the substrate; and
- a peripheral contact outside of the memory stack and in contact with the peripheral device.

14. The 3D memory device of claim 1, wherein the TAC has a circular shape in a plan view.

15. The 3D memory device of claim 11, wherein the TAC has a circular shape in a plan view.

16. A three-dimensional (3D) memory device, comprising:
- a substrate;
- a memory stack on the substrate comprising interleaved a plurality of conductive layers and dielectric layers;
- a channel structure extending vertically through the memory stack;
- a source contact extending vertically through the memory stack; and
- a through array contact (TAC) extending vertically through the memory stack,
- wherein the TAC comprises a conductor layer and a spacer in a plurality of shallow recesses abutting a sidewall of the TAC.

17. The 3D memory device of claim 16, wherein the TAC has a circular shape in a plan view.

18. The 3D memory device of claim 16, further comprising a dummy channel structure filled with a dielectric layer and extending vertically through the memory stack.

19. The 3D memory device of claim 18, wherein the dielectric layer in the dummy channel structure and the spacer in the TAC comprise silicon oxide.

20. The 3D memory device of claim 16, further comprising:
- a peripheral device on the substrate; and
- a peripheral contact outside of the memory stack and in contact with the peripheral device.

* * * * *